(12) United States Patent
Chen et al.

(10) Patent No.: US 11,769,696 B2
(45) Date of Patent: Sep. 26, 2023

(54) METHOD FOR FABRICATING A SEMICONDUCTOR DEVICE

(71) Applicant: TAIWAN SEMICONDUCTOR MANUFACTURING COMPANY, LTD., Hsinchu (TW)

(72) Inventors: Chun-Yuan Chen, Hsinchu (TW); Li-Zhen Yu, Hsinchu (TW); Huan-Chieh Su, Hsinchu (TW); Lo-Heng Chang, Hsinchu (TW); Cheng-Chi Chuang, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/873,605

(22) Filed: Jul. 26, 2022

(65) Prior Publication Data

US 2022/0367280 A1 Nov. 17, 2022

Related U.S. Application Data

(63) Continuation of application No. 17/184,835, filed on Feb. 25, 2021, now Pat. No. 11,437,279.

(51) Int. Cl.
| | |
|---|---|
| *H01L 21/8234* | (2006.01) |
| *H01L 21/768* | (2006.01) |
| *H01L 21/762* | (2006.01) |
| *H01L 21/8238* | (2006.01) |
| *H01L 29/417* | (2006.01) |
| *H01L 29/423* | (2006.01) |
| *H01L 29/66* | (2006.01) |
| *H01L 29/786* | (2006.01) |

(52) U.S. Cl.
CPC .. *H01L 21/823418* (2013.01); *H01L 21/7682* (2013.01); *H01L 21/76224* (2013.01); *H01L 21/823431* (2013.01); *H01L 21/823481* (2013.01); *H01L 21/823814* (2013.01); *H01L 29/41791* (2013.01); *H01L 29/42392* (2013.01); *H01L 29/66795* (2013.01); *H01L 29/78696* (2013.01); *H01L 29/6681* (2013.01)

(58) Field of Classification Search
CPC ............ H01L 21/762; H01L 21/76224; H01L 21/7682; H01L 21/823418; H01L 21/823431; H01L 21/823481; H01L 21/823814; H01L 21/823821; H01L 21/823878; H01L 29/41791; H01L 29/42392; H01L 29/66795; H01L 29/6681; H01L 29/785; H01L 29/7851; H01L 29/78642; H01L 29/78696; B82Y 10/00; B82Y 40/00

See application file for complete search history.

(56) References Cited

U.S. PATENT DOCUMENTS

2019/0333820 A1  10/2019  Chang et al.

*Primary Examiner* — Cheung Lee
(74) *Attorney, Agent, or Firm* — Birch, Stewart, Kolasch & Birch, LLP

(57) ABSTRACT

During a front side process of a wafer, a hard mask layer is formed under a metal portion of a semiconductor device, and an epitaxial layer is deposited to form epitaxial portions of the semiconductor device. In a back side process of the wafer to cut the epitaxial layer, the metal portion is covered and protected by the hard mask layer from damages during etching of the epitaxial layer.

20 Claims, 29 Drawing Sheets

METHOD FOR FABRICATING A SEMICONDUCTOR DEVICE

PRIORITY CLAIM AND CROSS-REFERENCE

This application is a continuation of U.S. patent application Ser. No. 17/184,835, filed on Feb. 25, 2021, all of which are hereby expressly incorporated by reference into the present application.

BACKGROUND

The semiconductor integrated circuit (IC) industry has over the past decades experienced tremendous advancements and is still experiencing vigorous development. With the dramatic advances in IC design, new generations of ICs have smaller and more complex structures. Gate-all-around (GAA) devices (e.g., nanosheet transistors, nanorod transistors, nanowire transistors, etc.) have been developed to have a stacked nanosheet structure surrounded by a gate structure, so as to increase the effective channel width in a transistor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
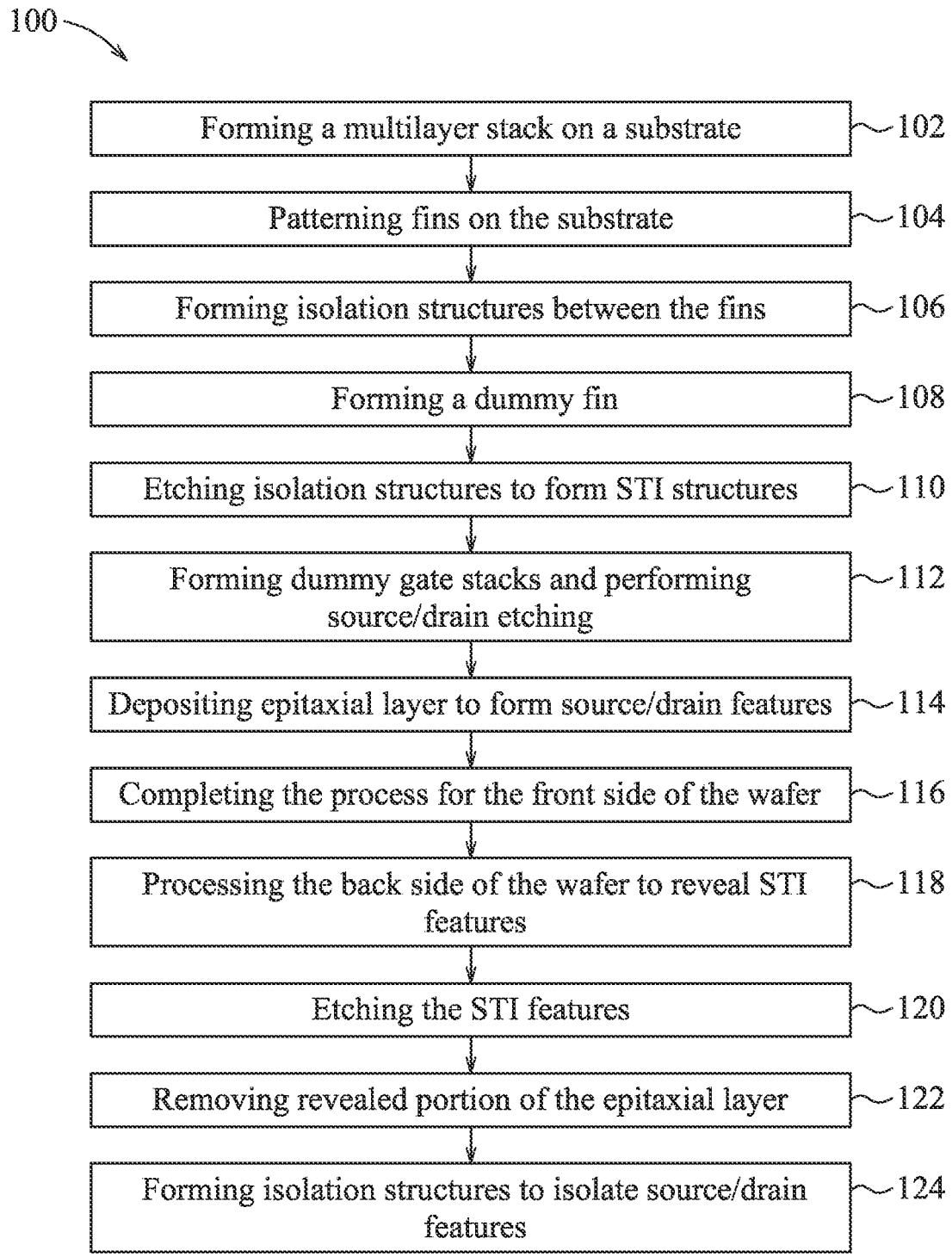
FIG. 1 is a flow chart illustrating a first semiconductor process in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure is related to semiconductor devices and fabrication methods thereof, and more particularly to GAA devices and formation of the same.

With development of the semiconductor industry, continuous shrinkage in size of circuit cells may lead to undesired merge of epitaxial regions of different semiconductor devices, such as source/drain regions of field-effect transistors (FETs). One option to isolate epitaxial regions between semiconductor devices is to cut the epitaxial regions from the backside of the wafer, which may benefit self-aligned etching.

FIGS. 2 to 15 illustrate perspective views of intermediate steps in the formation of a semiconductor structure on a wafer in accordance with some embodiments. The semiconductor structure is exemplified to include nanosheet FETs. Corresponding processes are also reflected in the flow chart 100 as shown in FIG. 1. The flow chart 100 is merely an example and is not intended to limit the present disclosure beyond what is explicitly recited in the claims, Additional processes can be provided before, during, and after the processes in the flow chart 100, and some processes described can be replaced, eliminated, or moved around for additional embodiments of the method. Processes 102-116 are performed on a front-side of the wafer, and processes 118-124 are performed on a back-side of the wafer. It should be noted that the positional relationships among structural features are described by referencing a front side of the wafer with an upward vertical axis in FIGS. 2 through 9, and by referencing a back side of the water with an upward vertical axis in FIGS. 10 through 15.

Figure 2:
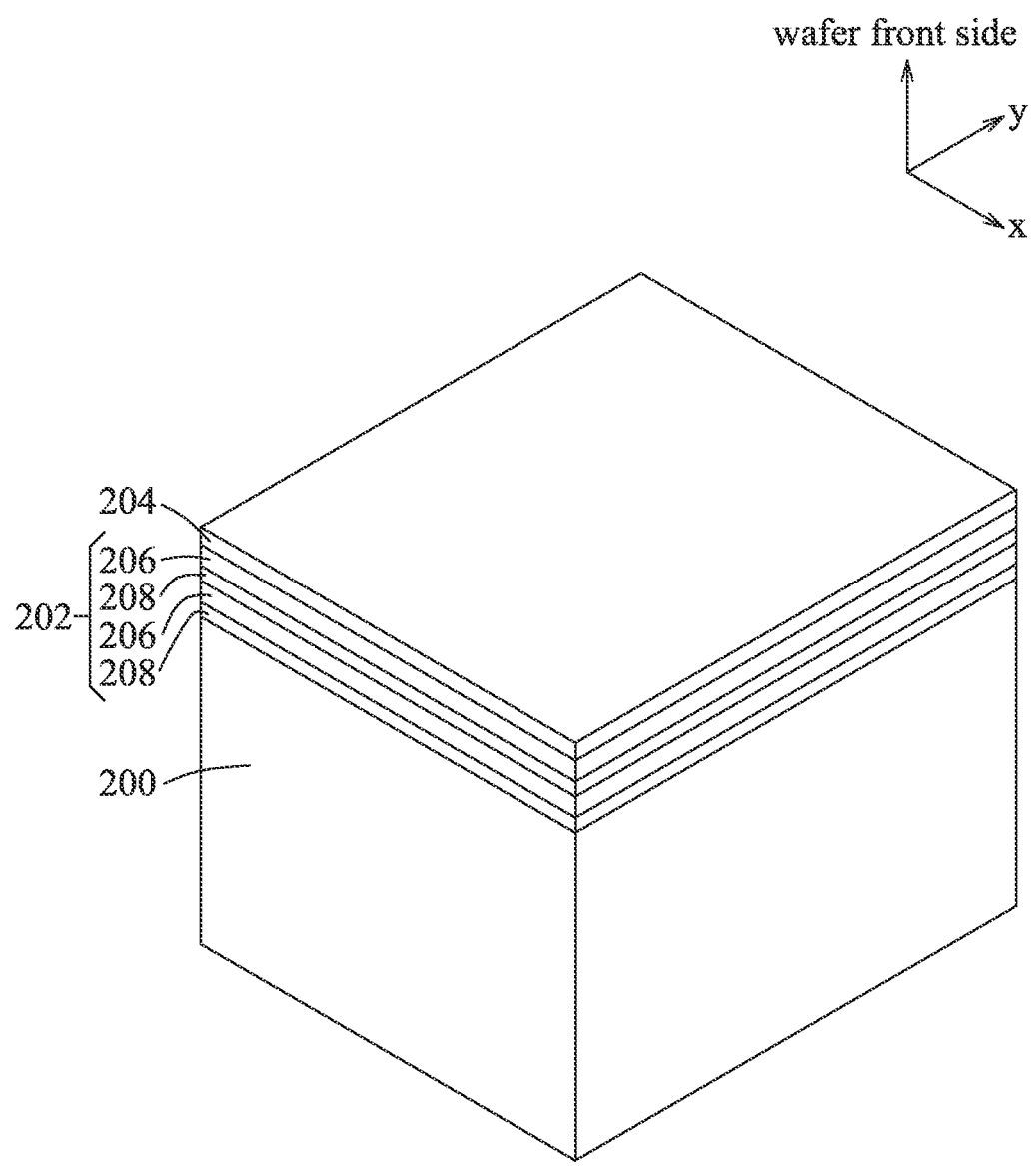
FIGS. 2 through 15 are perspective views that illustrate intermediate steps of the semiconductor process in accordance with some embodiments.

As shown in FIG. 2, in accordance with some embodiments, a substrate 200 is provided to have thereon a multilayer stack 202 and a mask layer 204 formed over the multilayer stack 202. This process is illustrated as process 102 in the flow chart 100 shown in FIG. 1. The substrate 200 may include: an elemental (single element) semiconductor material, such as silicon, germanium, and/or other suitable materials; a compound semiconductor material, such as silicon carbide, gallium arsenic, gallium phosphide, indium phosphide, indium arsenide, indium antimonide, and/or other suitable materials; and/or an alloy semiconductor material, such as SiGe, GaAsP, AlInAs, AlGaAs, GaInAs, GaInP, GaInAsP, and/or other suitable materials. The substrate 200 may be of a single-layer material having a uniform composition. Alternatively, the substrate 200 may include multiple material layers having similar or different compositions suitable for IC device manufacturing. In one example, the substrate 200 may be a silicon-on-insulator (SOI) substrate having a silicon layer formed on a silicon oxide layer. In another example, the substrate 200 may include a conductive layer, a semiconductor layer, a dielectric layer, other layers, or combinations thereof.

The multilayer stack 202 includes epitaxial layers 206 and epitaxial layers 208 alternating with each other. The epitaxial layers 206 include a semiconductor material different from that of the epitaxial layers 208. In some embodiments, the epitaxial layers 208 include silicon germanium (SiGe) and the epitaxial layers 206 include silicon (Si). In some embodiments, either of the epitaxial layers 206 and 208 may include other elemental semiconductor material such as germanium and/or other suitable materials, a compound semiconductor material such as silicon carbide, gallium arsenide, gallium phosphide, indium phosphide, indium arsenide, indium antimonide, and/or other suitable materials, an alloy semiconductor material such as SiGe, GaAsP, AlInAs, AlGaAs, InGaAs, GaInP, GaInAsP, and/or other suitable materials, or combinations thereof. In some embodiments, the epitaxial layers 206 include GaAs and the epitaxial layers 208 include SiGe. In some embodiments, the epitaxial layers 206 include GaAs and the epitaxial layers 208 include Si. In some embodiments, the epitaxial layers 206 include InGaAs and the epitaxial layers 208 include SiGe. Forming the multilayer stack 202 includes alternatingly growing the epitaxial layers 208 and 206 in a series of epitaxy processes. The epitaxy processes may include chemical vapor deposition (CVD) techniques (for example, but not limited to, vapor-phase epitaxy (VPE), ultra-high vacuum CVD (UHV-CVD), low-pressure CVD (LP-CVD), and/or plasma-enhanced CVD (PE-CVD)), molecular beam epitaxy, other suitable selective epitaxial growth (SEG) processes, or combinations thereof. The epitaxy processes may use gaseous and/or liquid precursors, which interact with the composition of the substrate 200, In some examples, the epitaxial layers 206 and 208 may be provided in the form of nanosheets, nanowires, or nanorods. In some embodiments, the mask layer 204 may be a dielectric layer that includes any suitable dielectric material such as silicon, oxygen, carbon, nitrogen, other suitable elements, or combinations thereof (represented as $SiO_xN_yC_z$, noting that x, y, and z can be adjusted according to a film property required for this structure/process/device), or other dielectric materials. For example, the dielectric layer may include silicon oxide, silicon nitride, oxygen-doped silicon nitride, carbon-doped silicon nitride, silicon carbide, or combinations thereof. In some embodiments, the mask layer 204 can be deposited by any suitable method, such as atomic layer deposition (ALD), CVD, physical vapor deposition (PVD), other suitable methods, or combinations thereof.

Figure 3:
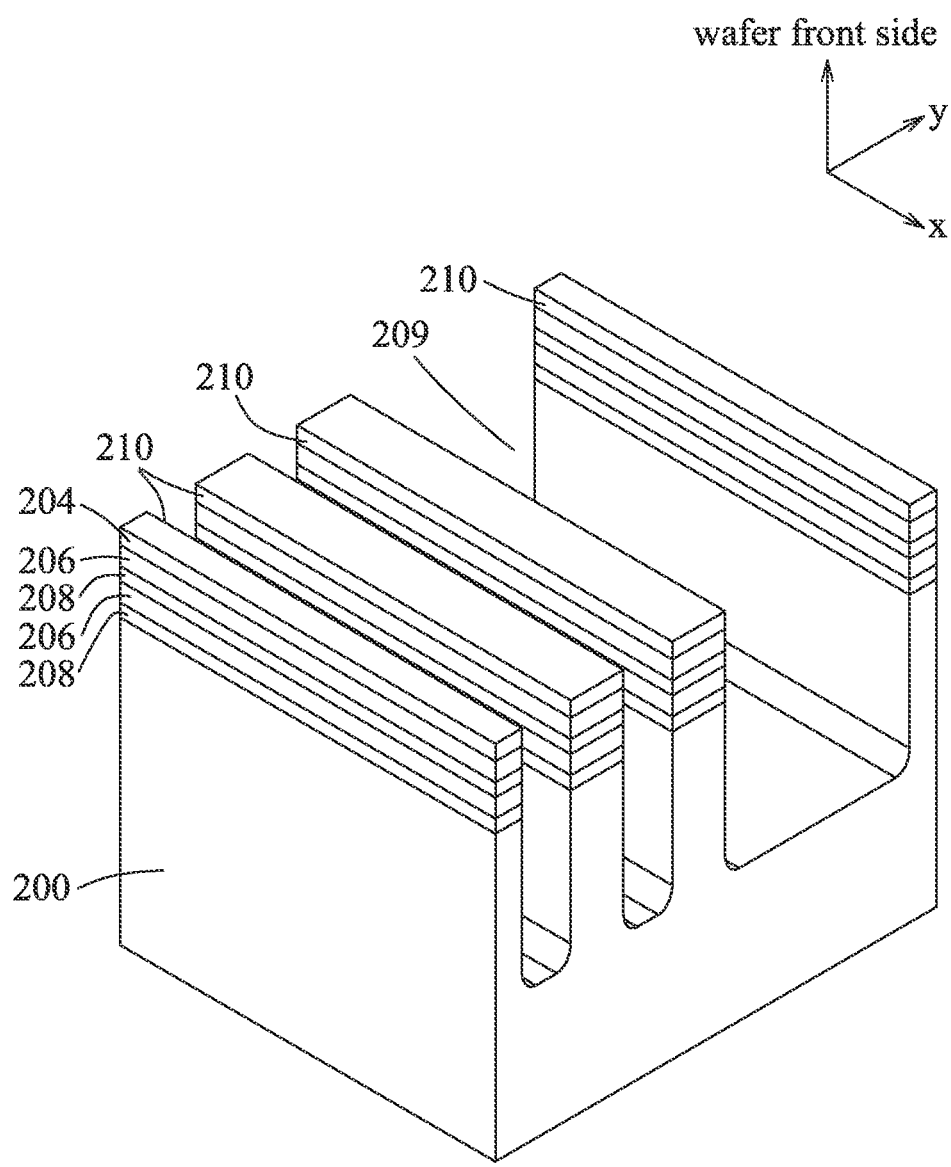

The method then proceeds to process 104, which corresponds to FIG. 3, where multiple fin features (referred to as fins 210 hereinafter) that extend from the substrate 200 are patterned. A relatively wider recess 209 is optionally formed for making a dummy fin therein in the subsequent process. The dummy fin is made for the purpose of, for example, reducing an etching depth during a poly etch process, reducing a risk of forming an undercut profile at the fins 210 during the poly etch process when a distance between the fins 210 is large, etc. However, the dummy fin is not an essential structure for this method. The number of the fins 210 is for illustrative purposes only and is not intended to be limiting beyond what is specifically recited in the claims. It can be appreciated that any number of the fins 210 can be formed depending on the desired number of transistors to be formed in the process. In the illustrative embodiment, the fins 210 are spaced apart along a Y-direction, and each of them extends lengthwise along an X-direction transverse to the Y-direction. In various embodiments, each of the fins 210 includes a substrate portion formed from the substrate 200 and portions of each of the epitaxial layers 206, 208 of the epitaxial stack 202. The fins 210 may be fabricated using suitable processes including double-patterning or multi-patterning processes. In general, double-patterning or multi-patterning processes combine photolithography and self-aligned processes, allowing patterns to be created to have, for example, pitches smaller than what is otherwise obtainable using a single, direct photolithography process. Then, the mask layer 204 and the multilayer stack 202 may be etched using dry etching, wet etching, reactive ion etching (RIE), and/or other suitable processes.

Figure 4:
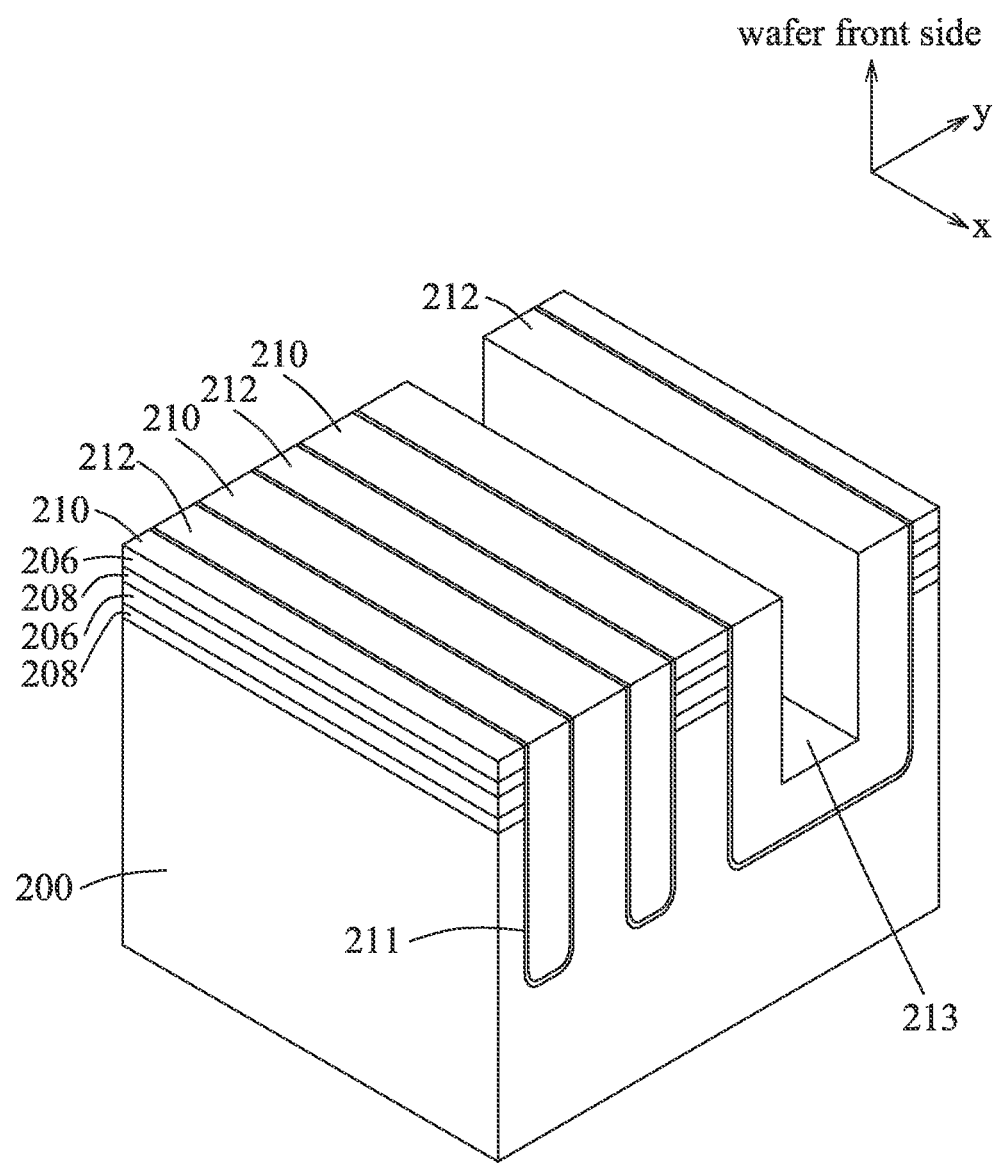

The method then proceeds to process 106 that corresponds to FIG. 4, where isolation structures 212 are formed in recesses between the fins 210. The isolation structures 212 may be made of, for example, silicon oxide, silicon nitride, silicon oxynitride, fluoride-doped silicate glass (FSG), a low-k dielectric material (i.e., a dielectric material that has a dielectric constant smaller than that of silicon dioxide), and/or other suitable materials. Each isolation structure 212 may include a liner layer 211 formed using, for example, ALD and/or other suitable process. The liner layer 211 may be a dielectric layer that includes any suitable dielectric material $SiO_xN_yC_z$ (noting that x, y, and z can be adjusted according to a film property required for this structure/process/device) or other dielectric materials. The liner layer 211 may protect the fins 210 from damages during the etching of the isolation structures 212 in the subsequent process. The isolation structures 212 may be formed by depositing the abovementioned materials, followed by a chemical mechanical planarization (CMP) process. Other isolation structure such as a field oxide, a local oxidation of silicon (LOCOS) structure, and/or other suitable structures may also be implemented as the isolation structures 212. Alternatively, the isolation structures 212 may include a multi-layer structure, for example, having one or more thermal oxide liner layers. The isolation structures 212 may be deposited by any suitable method, such as CND, flowable CVD (FCVD), spin-on-glass (SOG), other suitable methods, or combinations thereof. Subsequently, in order to form the dummy fin, the isolation structure 212 filled in the wider recess 209 may be etched to form a recess 213 using dry etching, wet etching, RIE, and/or other suitable processes, while the isolation structures 212 filled in the other recesses are protected from etching using, for example but not limited to, photolithography processes.

Figure 5:
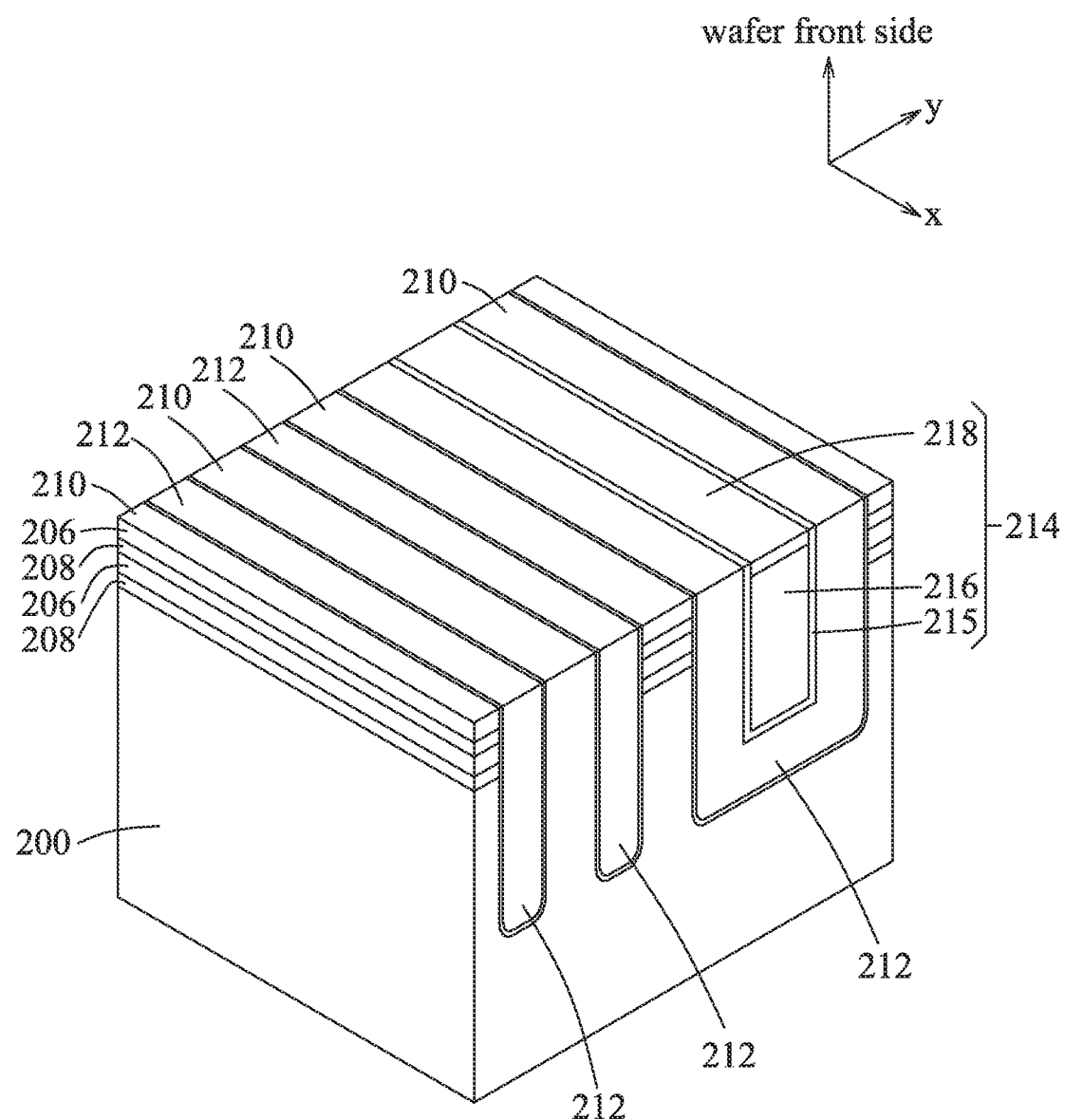

The method then proceeds to process 108 that corresponds to FIG. 5, where a dummy fin structure 214 is formed in the recess 213. The dummy fin structure includes a liner layer 215, a dielectric fin 216 over the liner layer 215, and a mask layer 218 over the dielectric fin 216. The liner layer 215 may include any suitable dielectric material $SiO_xN_yC_z$ (noting that x, y, and z can be adjusted according to a film property required for this structure/process/device) or other dielectric materials. In some embodiments, the liner layer 215 may be formed by, for example but not limited to, ALD. The dielectric fin 216 may include, for example, silicon oxide, silicon nitride, silicon oxynitride, FSG, a low-k dielectric material, and/or other suitable materials, and may be formed by, for example, CVD, PVD, other suitable methods, or combinations thereof. The mask layer 218 may include any suitable dielectric material $SiO_xN_yC_z$ (noting that x, y, and z can be adjusted according to a film property required for this structure/process/device) or other dielectric materials.

Figure 6:
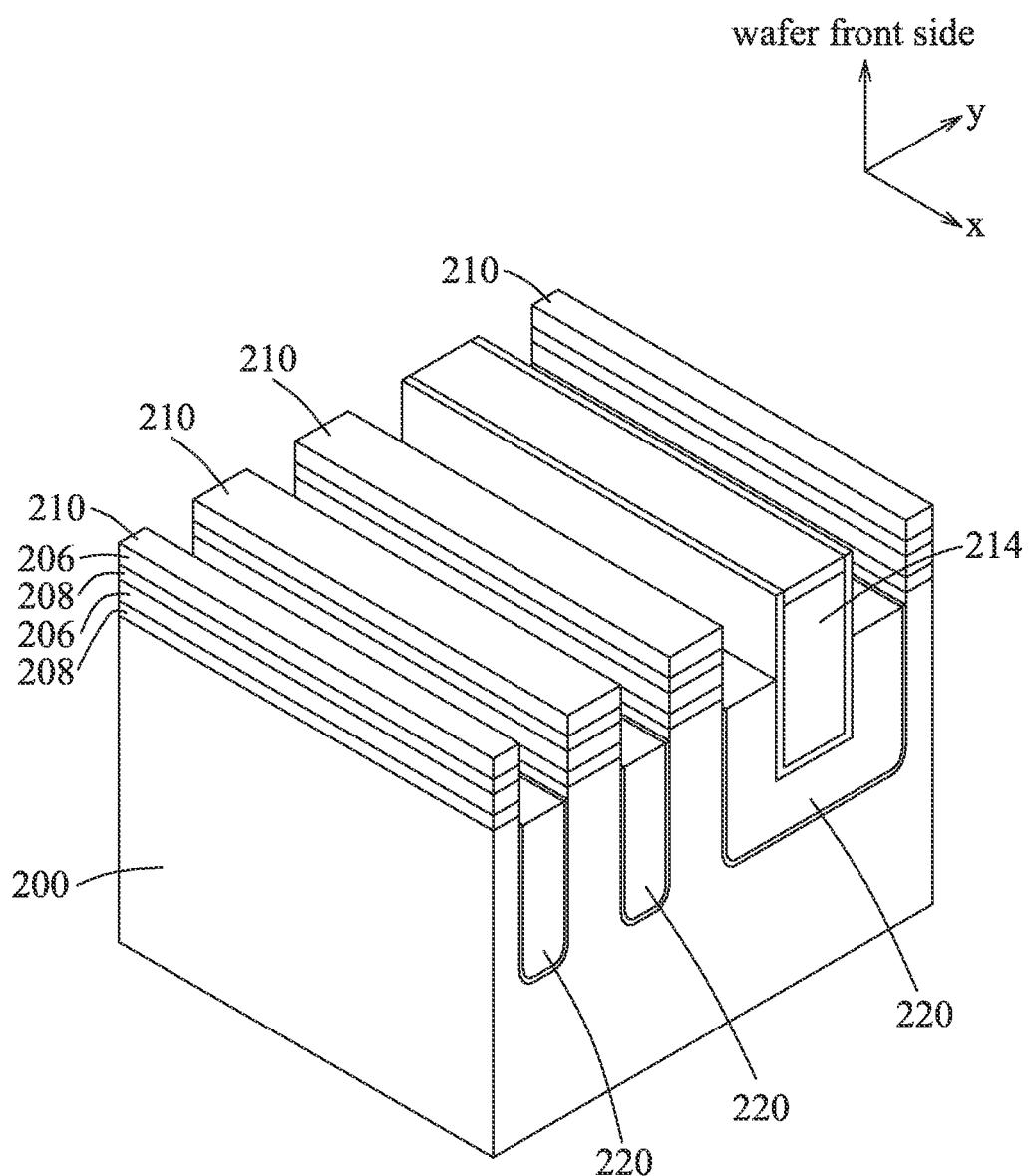

The method then proceeds to process 110 that corresponds to FIG. 6, where a shallow trench isolation (STI) etching process is performed to etch the isolation structures 212 so as to reveal the fins 210 and the dummy fin 214, and so as to form STI features 220. The top surfaces of the STI features 220 serve as a reference substrate surface from which the base fins (a portion of the fins 210 that is revealed) extend in the illustrative embodiment. The STI etching process may be performed using dry etching, wet etching, RIE, and/or other suitable processes.

Figure 7:
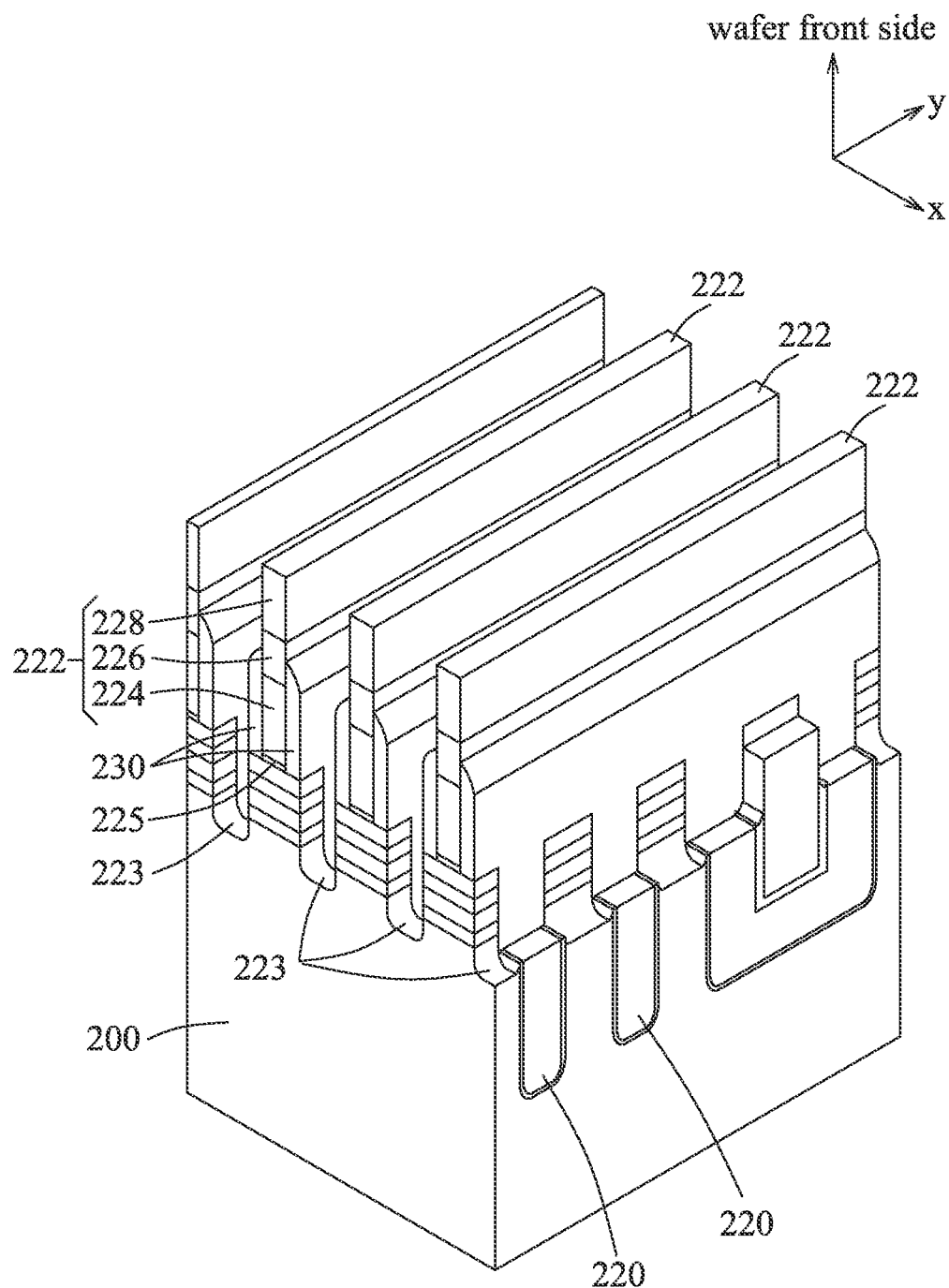

The method then proceeds to process 112 that corresponds to FIG. 7, where dummy gate stacks 222 are formed over the fins 210, and source/drain etching is performed to recess the fins 210 to form source/drain recesses 223, thereby defining gate regions and source/drain regions (active regions) for the FETs. Each dummy gate stack 222 may include a polysilicon layer 224 over the fin 210, a dielectric layer 225 disposed between the polysilicon layer 224 and the fin 210, a hard mask layer 226 (e.g., including any suitable dielectric material $SiO_xN_yC_z$ (noting that x, y, and z can be adjusted according to a film property required for this structure/process/device) or other dielectric materials) over the polysilicon layer 224, and a dielectric layer 228 (including, e.g., silicon oxide, silicon nitride, silicon oxynitride, FSG, a low-k dielectric material, and/or other suitable materials) over the hard mask layer 226. The dummy gate stacks 222 may be formed by performing a series of deposition and patterning processes. Then, top spacers 230 may be formed on the sidewalk of the dummy gate stacks 222. The top spacers 230 may be a single-layer structure or a multi-layer structure, and may include silicon oxide, silicon nitride, silicon carbide, silicon oxynitride, silicon oxycarbide, other suitable materials, or combinations thereof. The top spacers 230 may be formed by first depositing a dielectric layer over the dummy gate stacks 222 and subsequently removing portions of the dielectric layer in an anisotropic etching process (e.g., a dry etching process), leaving portions of the dielectric layer on the sidewalk of the dummy gate stacks 222 as the top spacers 230. The series of deposition and etching processes may be repeated if a multi-layer structure is desired. Subsequently, one or more etching processes are performed to remove portions of the multilayer stack 202 disposed between the dummy gate stacks 222 to form the source/drain recesses 223. The etching process may include a dry etching process, a wet etching process, RIE, or combinations thereof.

Figure 8:
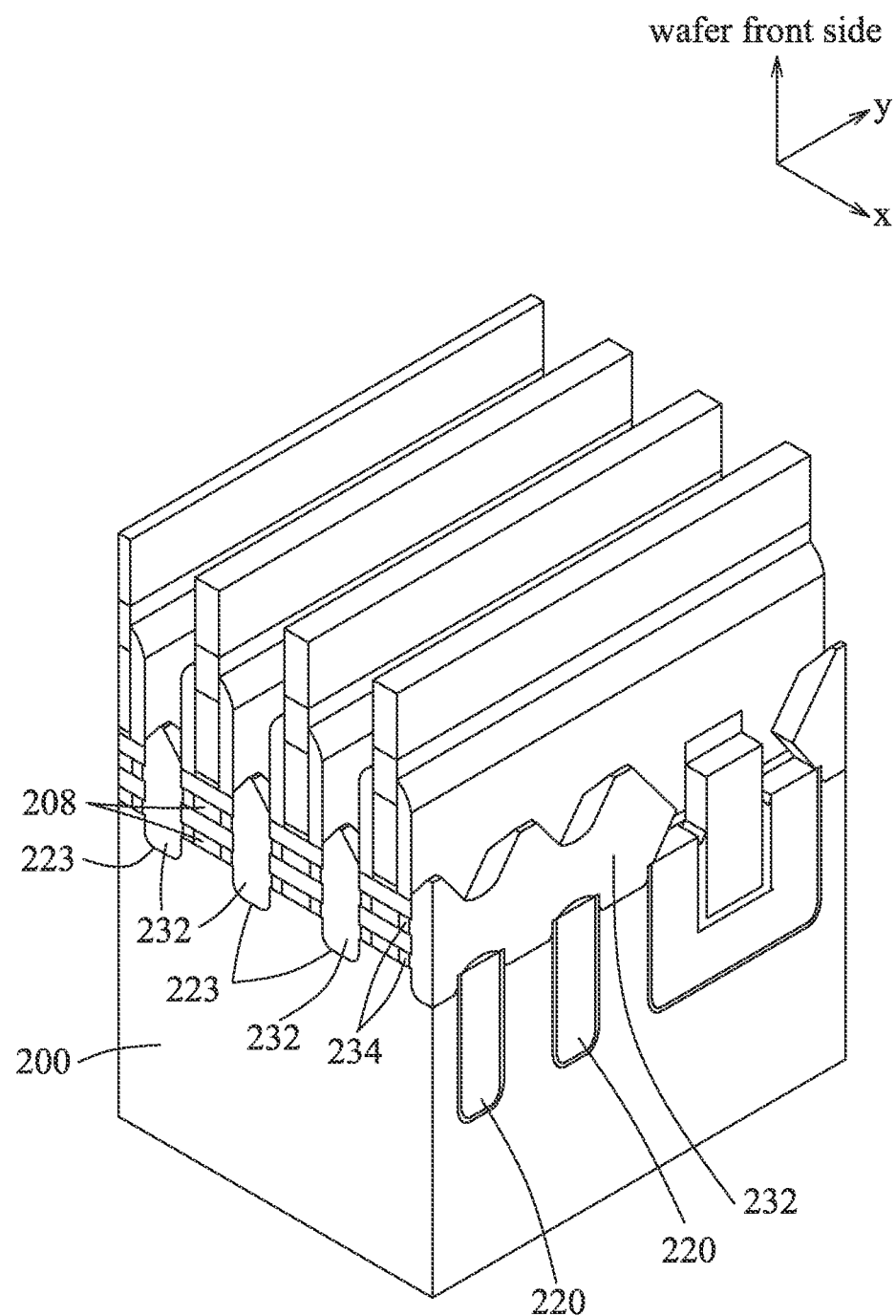

The method then proceeds to process 114 that corresponds to FIG. 8, where an epitaxial layer 232 is deposited in the source/drain recesses 223 to form source/drain features. Before the epitaxial layer 232 is grown, portions of the epitaxial layers 208 that are exposed in the source/drain recesses 223 may be removed using a suitable etching process such as a dry etching process, a wet etching process, RIE, or combinations thereof. Then, inner spacers 234 are formed on the sidewalls of the epitaxial layers 208 and fill the recesses that are formed by etching the portions of the epitaxial layers 208. The inner spacers 234 may include any suitable dielectric material $SiO_xN_yC_z$ (noting that x, y, and z can be adjusted according to a film property required for this structure/process/device) or other dielectric materials. For example, the inner spacers 234 may include silicon oxide, silicon nitride, oxygen-doped silicon nitride, carbon-doped silicon nitride, silicon carbide, or combinations thereof. The inner spacers 234 may be formed using any suitable method, such as ALD, CVD, PVD, other suitable methods, or combinations thereof, followed by a suitable etching process, such as dry etching, wet etching, RIE, or combinations thereof. The epitaxial layer 232 may be formed using any suitable techniques. In some embodiments, one or more epitaxial growth processes are performed to grow an epitaxial material in the source/drain recesses 223 to form the epitaxial layer 232. Each epitaxial layer 232 may be suitable for forming a p-type FET device including a p-type epitaxial material) or alternatively, an n-type FET device (e.g., including an n-type epitaxial material). The p-type epitaxial material may include one or more epitaxial layers of silicon germanium (epi SiGe), where the silicon germanium is doped with a p-type dopant such as boron, germanium, gallium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. In some embodiments, the epitaxial material is doped in-situ by adding a dopant to a source material during the epitaxial growth process. In some embodiments, the epitaxial material is doped by an ion implantation process after performing a deposition process. In some embodiments, an annealing process is subsequently performed to activate the dopants in the epitaxial layer 232.

With the advancement of the semiconductor technology, the sizes of the circuits become smaller and smaller, but shrinkage of distances between circuit components, such as FETs, may cause some of the epitaxial source/drain features that are supposed to be separated from each other to merge together. Accordingly, an etching process would be required in the subsequent process to cut the epitaxial layer 232, thereby isolating the undesiredly merged epitaxial source/drain features. In the illustrative embodiment, the epitaxial layer 232 includes epitaxial source/drain features 232a, 232b and 232c that are undesiredly merged together, and may be etched to isolate the epitaxial source/drain features 232a, 232b and 232c from each other in the subsequent process.

Figure 9:
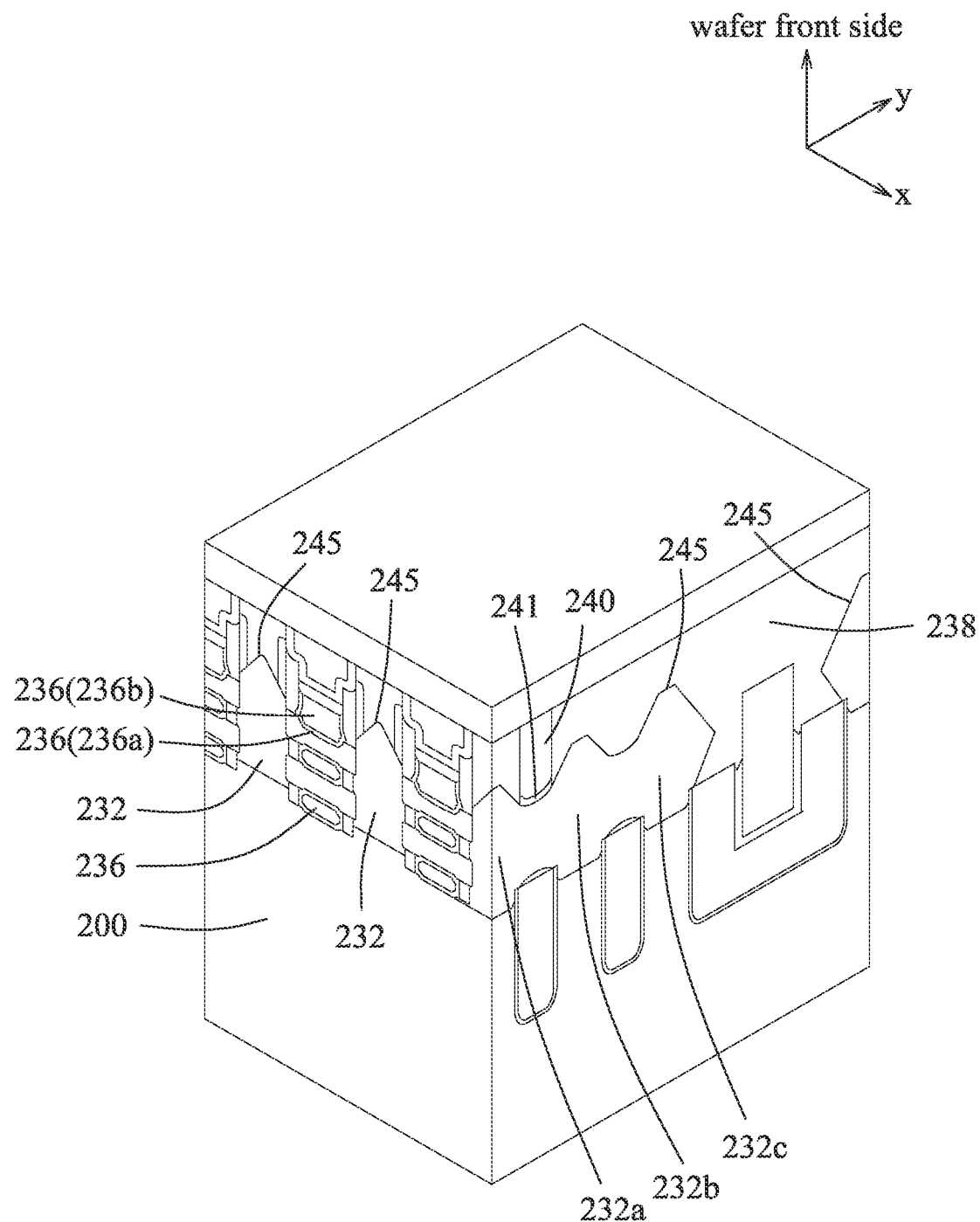

The method then proceeds to process 116 that corresponds to FIG. 9, where the remaining process for the front side of the wafer is completed. The remaining process may depend on the circuit design, and may vary in different embodiments. In the illustrative embodiment, the remaining process may include a gate replacement process (including dummy gate and channel release, gate filling, etc.) to form gate features 236, deposition of interlayer dielectrics, formation of metallic contact layers source/drain contacts 238), patterning the contact layers, formation of isolation features (e.g., the isolation feature 240 in FIG. 9) to isolate parts of the metallic contact layers that should not be in connection with each other, and so on. The isolation feature 240 is an interlayer dielectric, which may include any suitable dielectric material $SiO_xN_yC_z$ (noting that x, y, and z can be adjusted according to a film property required for this structure/process/device) or other dielectric material. For example, the isolation feature 240 may be made of, for example, silicon oxide, silicon nitride, silicon oxynitride, FSG, a low-k dielectric material, and/or other suitable materials. The isolation feature 240 is fine-tuned for good gap-filling capability. In some embodiments, the isolation feature 240 may be formed by a process including flowable filling and annealing. In some embodiments, the film quality of the isolation feature 240 may be porous for low parasitic capacitance. In some embodiments, the isolation feature 240 may include an etch stop layer 241 at a bottom thereof. The etch stop layer 241 may include any suitable dielectric material $SiO_xN_yC_z$ (noting that x, y, and z can be adjusted according to a film property required for this structure/process/device) or other dielectric materials, which are fine-tuned for good protection from oxygen and/or H2O. The gate features 236 may include a dielectric layer 236a and a metal gate electrode 236b disposed on the dielectric layer 236a. In some embodiments, the dielectric layer 236a may include any suitable high-k dielectric material (i.e., a dielectric material that has a dielectric constant greater than that of silicon dioxide), such as tungsten oxide, hafnium oxide, lanthanum oxide, other suitable materials, or combinations thereof. The metal gate electrode 236b may include a work function metal layer (optional) and a bulk conductive layer disposed thereon. The work function metal layer may be a p-type or an n-type work function metal layer. Exemplary work function materials include TiN, TaN, Ru, Mo, Al, WN, ZrSi2, MoSi2, TaSi2, NiSi2, Ti, Ag, TaAl, TaAlC, TiAlN, TaC, TaCN, TaSiN, Mn, Zr, other suitable work function materials, or combinations thereof. The bulk conductive layer may include Cu, Ti, TiN, W, Al, Co, Ru, other suitable materials, or combinations thereof, and may be doped with, for example, La, Zr, Hf, and so on. The metallic contact layers that form the source/drain contacts 238 may be formed using any suitable conductive material, such as Co, W, Ru, Cu, Al, Mo, Ti, Ni, Au, Pt, Pd, other suitable conductive materials, or combinations thereof. In some embodiments, the metallic contact layers may be of a multi-layer structure, and optionally include a liner layer that includes, for example, Ti, Ta, TiN, TaN, other suitable materials, or combinations thereof. A silicide layer 245 may be formed between the source/drain contacts 238 and the epitaxial layer 232. The silicide layer 245 may include, for example, Ti Si, NiSi, other suitable materials, or a combination thereof, and may be doped with La, Ga, other suitable materials, or a combination thereof.

After completion of the processes for the front side of the wafer, the following processes are performed for the back side of the wafer to cut the epitaxial layer 232 to isolate the undesiredly merged source/drain features 232a, 232b, 232c from each other.

Figure 10:
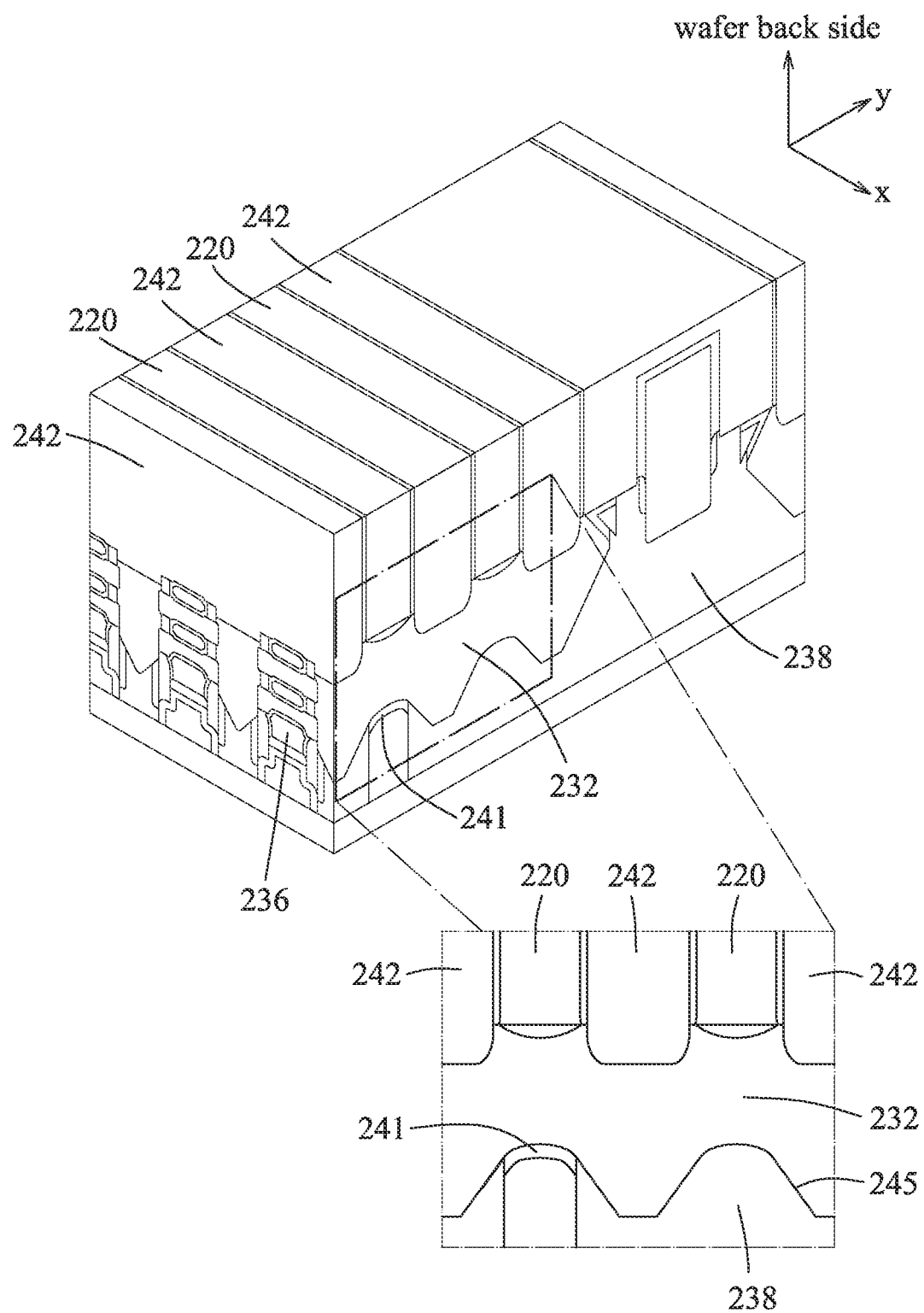

The method proceeds to process 118 that corresponds to FIG. 10, where the substrate 200 (see FIG. 9) is processed to reveal the back-side surface of the STI features 220 from the back side of the wafer. The ways to process the substrate 200 may vary as desired. In some embodiments, the substrate 200 may be processed using CMP techniques to remove a back-side portion of the substrate 200, so as to reveal the back-side surface of the STI features 220. In some embodiments, after the CMP process, the remaining portions of the substrate 200 may be removed to form a plurality of recesses between the STI features 220, and then a dielectric material is filled into the recesses between the STI features 220 to form mesa features 242 using any suitable process, such as PVD, CVD, ALD, other suitable process, or a combination thereof. The mesa features 242 can be of a multi-layer structure or a single layer structure, and may include any suitable dielectric material $SiO_xN_yC_z$, (noting that x, y, and z can be adjusted according to a film property required for this structure/process/device) or other dielectric materials. In some embodiments, the substrate 200 may be directly etched to form the recesses between the STI features 220, and then the dielectric material is filled into the recesses between the STI features 220 to form the mesa features 242. The material of the mesa features 242 may have a lower dielectric constant than the material of the substrate 200, so as to achieve better electric properties (e.g., lower parasitic capacitance).

Figure 11:
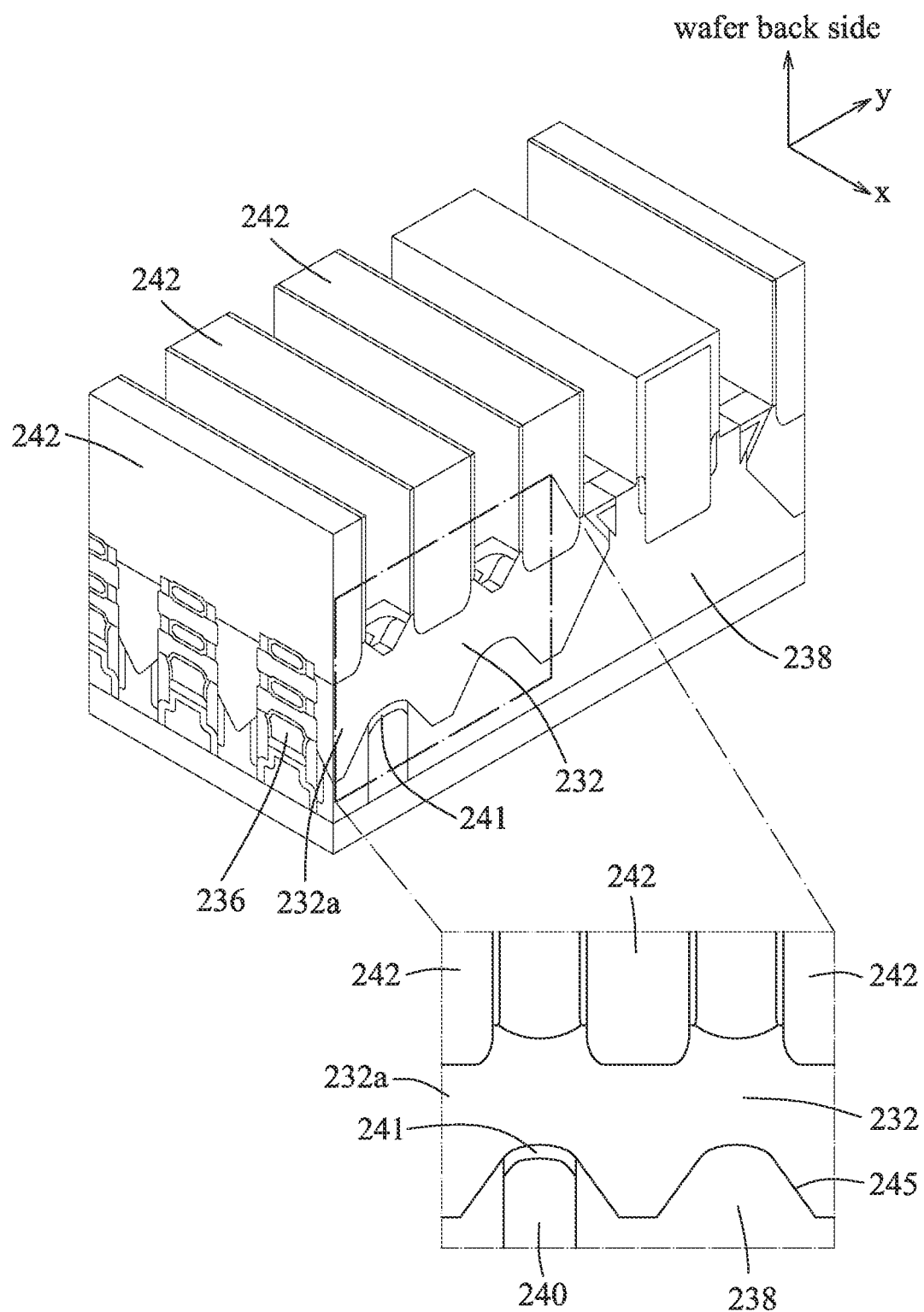
Figure 12:
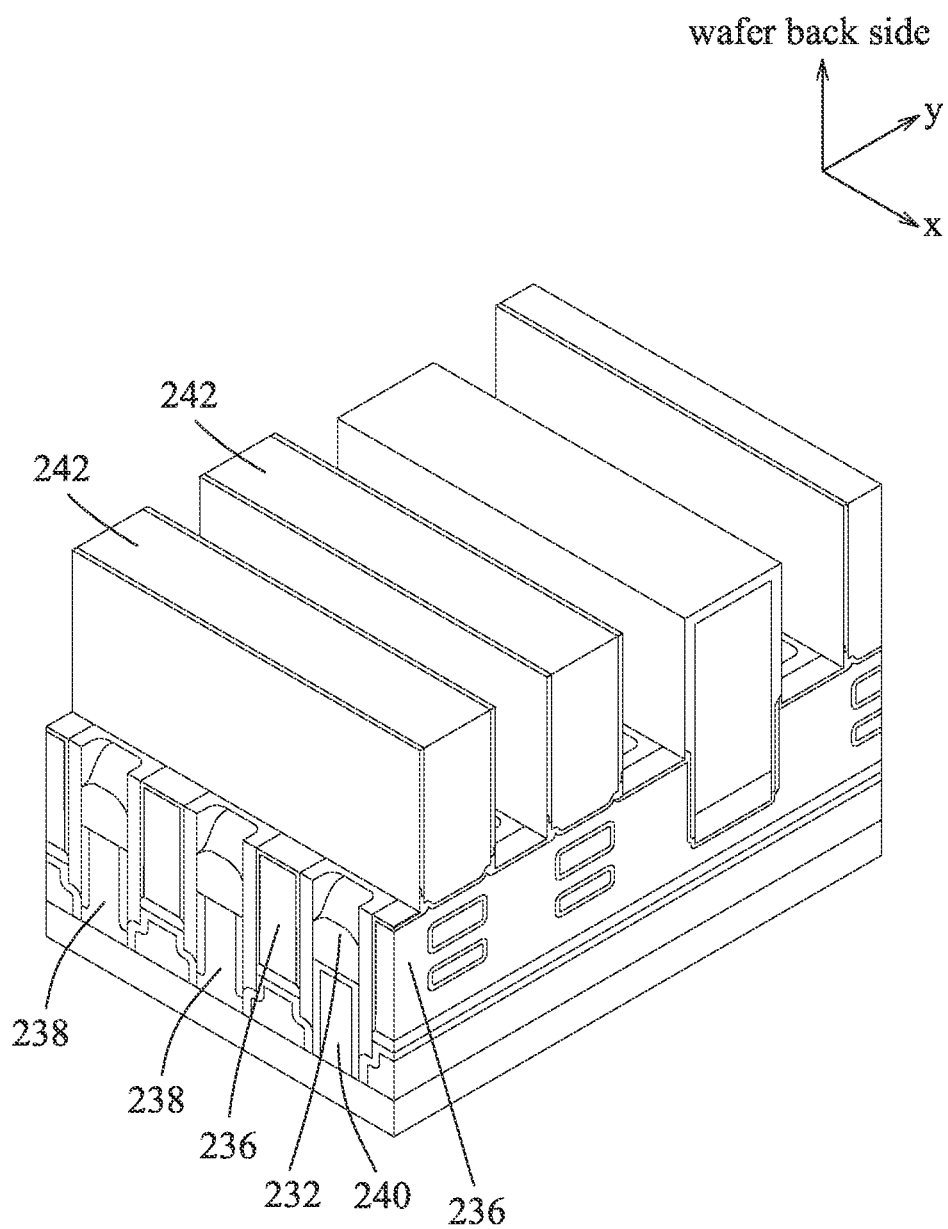

The method then proceeds to process 120 that corresponds to FIGS. 11 and 12, where the STI features 220 are etched to reveal portions of the epitaxial layer 232 that are disposed between the mesa features 242 from the backside of the wafer. The etching process may use dry etching, wet etching, RIE, and/or other suitable processes. FIG. 11 shows a perspective view with sectional views of an X-cut and a Y-cut on the source/drain feature 232a. FIG. 12 shows a perspective view with sectional views of an X-cut on a trench between the mesa features 242, and a Y-cut on the gate feature 236. After process 120, the gate features 236 are exposed in the trenches between the mesa features 242.

Figure 13:
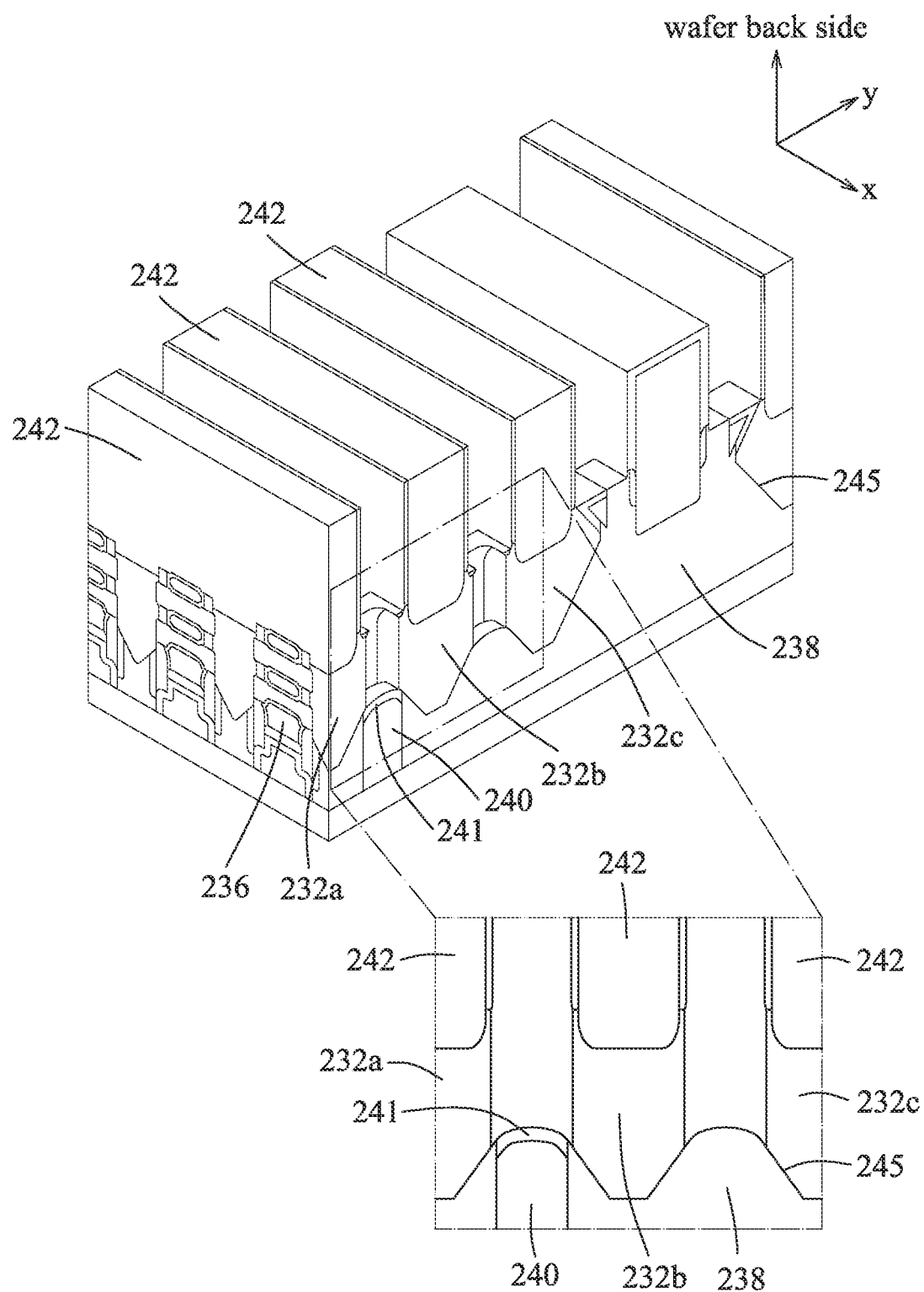
Figure 14:
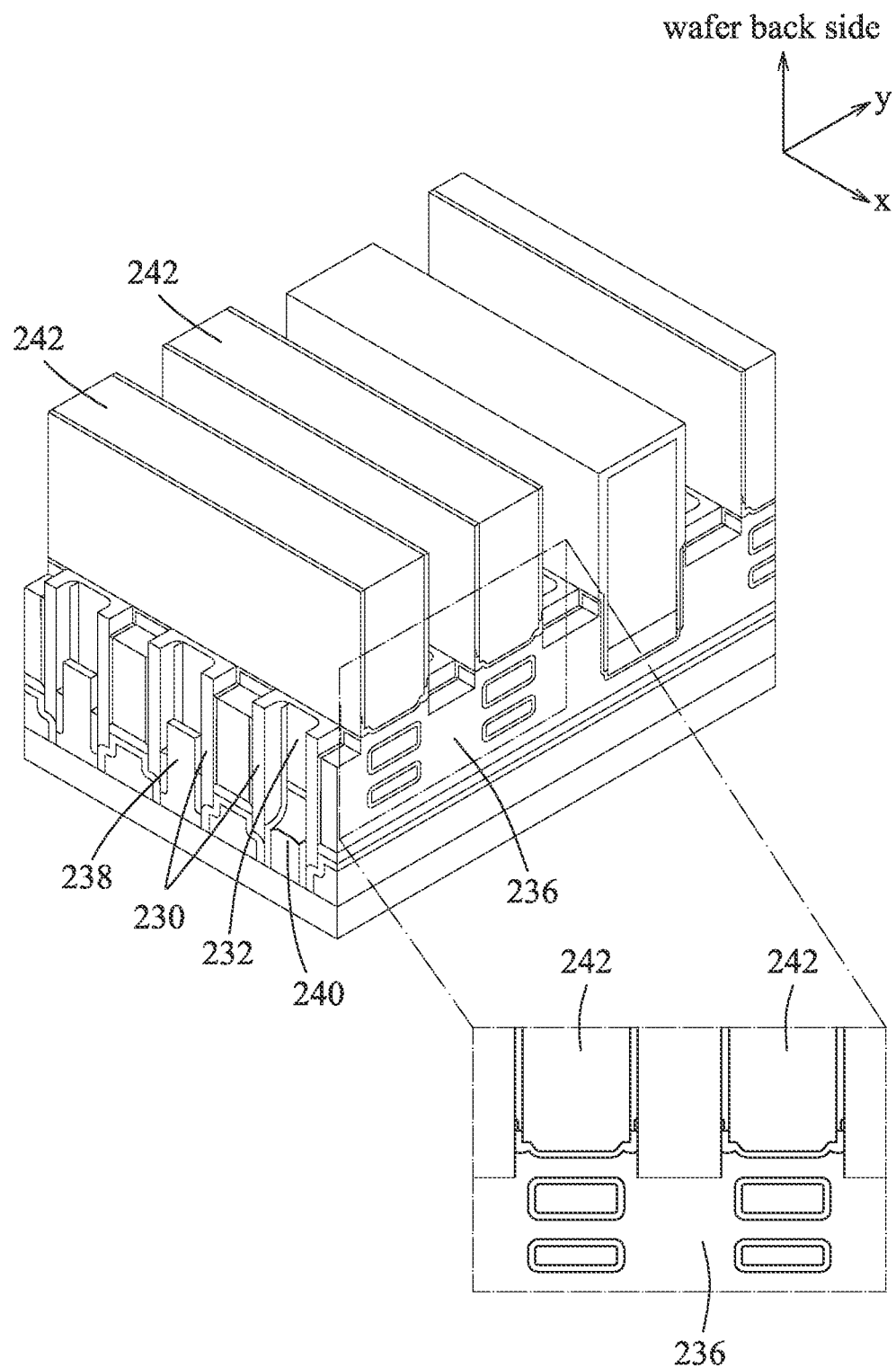

The method then proceeds to process 122 that corresponds to FIGS. 13 and 14, where the revealed portion of the epitaxial layer 232 (see FIGS. 11 and 12) is removed using dry etching, wet etching, RIE, and/or other suitable processes. The illustrative embodiment implements a dry etching process that uses an etchant including, for example, a chlorine-containing gas (e.g., $Cl_2$, $SiCl_4$, $BCl_3$, other chlorine-containing gases, or combinations thereof), a fluorine-containing gas (e.g., $CF_4$, $SF_6$, $CH_2F_2$, $CHF_3$, $C_2F_6$, other fluorine-containing etchants, or combinations thereof), a bromine-containing gas (e.g., HBr, other bromine-containing etchants, or combinations thereof), an argon-containing gas, other suitable gases, and/or combinations thereof. FIG. 13 shows a perspective view with sectional views of an X-cut and a Y-cut on the source/drain feature 232a. FIG. 14 shows a perspective view with sectional views of an X-cut on a trench between the mesa features 242, and a Y-cut on the gate feature 236. The portion of the epitaxial layer 232 previously exposed in the trenches between the mesa features 242 has been removed, while the portion of the epitaxial layer 232 (i.e., the source/drain features 232a, 232b, 232c) under the mesa features 242 is retained.

Figure 15:
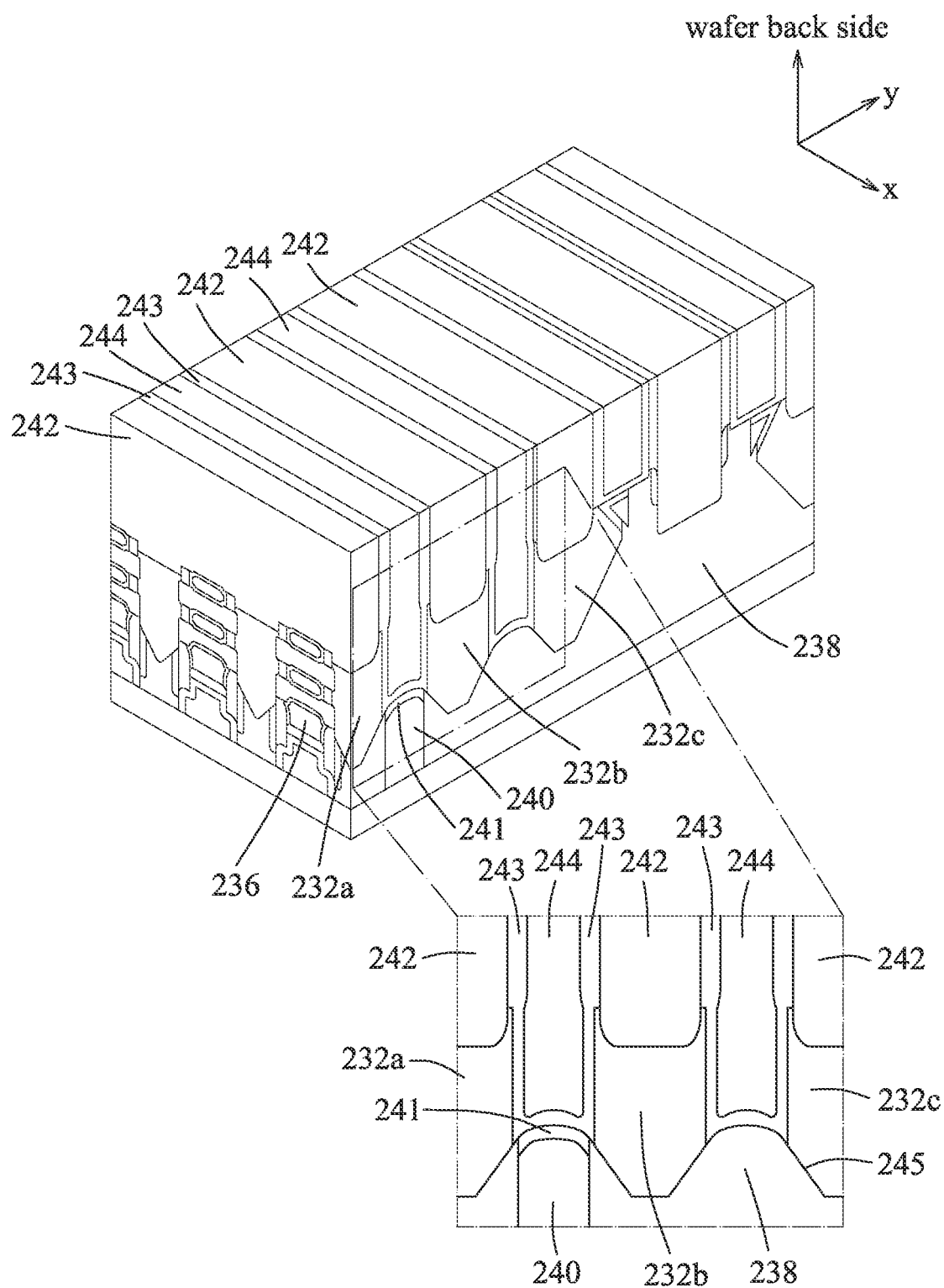

The method then proceeds to process 124 that corresponds to FIG. 15, where a dielectric material is filled in the trenches between the mesa features 242 to form isolation structures 244, thereby isolating the source/drain features 232a, 232b, 232c from each other. The isolation structures 244 may be made of, for example, silicon oxide, silicon nitride, silicon oxynitride, FSG, a low-k dielectric material, and/or other suitable materials. In some embodiments, each isolation structure 244 may include a liner layer 243 formed using, for example, ALD and/or other suitable process. The liner layer 243 may be a dielectric layer that includes any suitable dielectric material $SiO_xN_yC_z$ (noting that x, y, and z can be adjusted according to a film property required for this structure/process/device) or other dielectric materials. The isolation structures 244 may be formed by depositing the abovementioned materials, followed by a CMP process. Other isolation structure such as a field oxide, a LOCOS structure, and/or other suitable structures may also be implemented as the isolation structures 244. Alternatively, the isolation structures 244 may include a multi-layer structure, for example, having one or more thermal oxide liner layers. The isolation structures 244 may be deposited by any suitable method, such as CVD, FCVD, SDG, other suitable methods, or combinations thereof. As an example, the isolation structures 244 may include the liner layer 243 made of SiN and having a thickness of between 3 nm and 6 nm, with a flowable and seam-free oxide material fully filled in the trenches between the mesa features 242. In some embodiments, the isolation structures 244 may be formed by a single layer low-k material with some seams formed therein. In some embodiments, the film quality of the isolation structures 244 may be porous for low parasitic capacitance.

Figure 16:
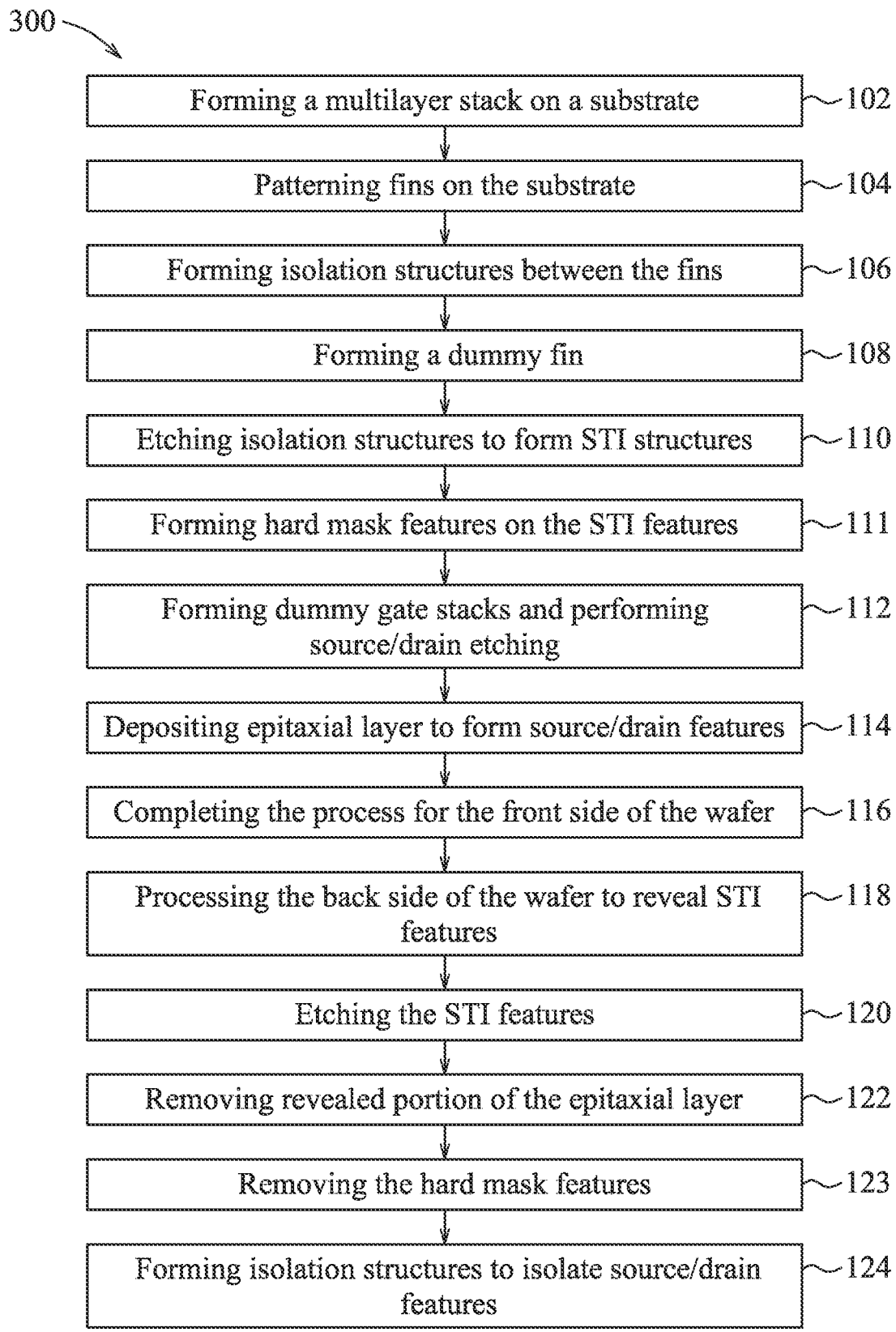
FIGS. 16 and 17 are flow charts illustrating a second semiconductor process in accordance with some embodiments.

By virtue of the back-side processes 118 through 124, the source/drain features 232a, 232b and 232c that are undesiredly merged during the front-side processes 102 through 116 are isolated from each other. However, referring to FIG. 12, since the gate features 236 are exposed in the trenches between the mesa features 242, a portion of the gate features 236 may be etched away in the etching process 122, as illustrated in FIG. 14, possibly resulting in adverse effects on the electric properties, such as threshold voltage drift, malfunction of the transistors, etc. In order to prevent the gate features 236 from being etched during the process of cutting the epitaxial layer 232, some embodiments may include further processes, as shown in FIG. 16.

The flow chart 300 differs from the flow chart 100 in that the flow chart 300 further includes process 111 between processes 110 and 112.

Figure 17:
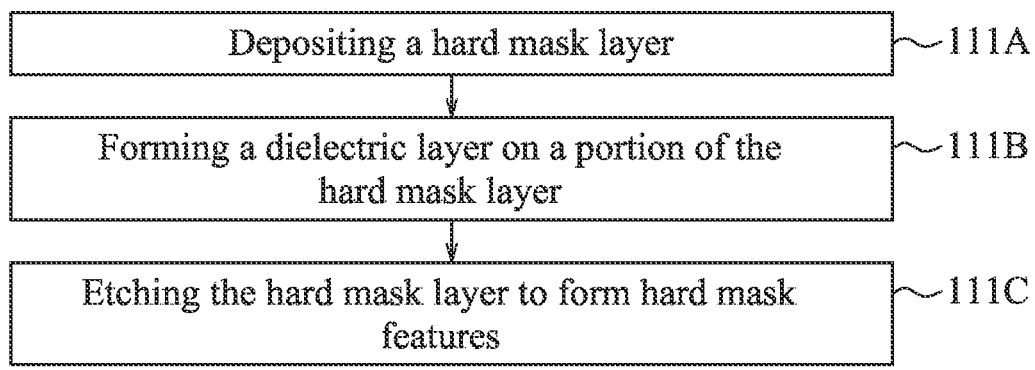

Process 111 forms a hard mask layer on the STI features 220 (see FIG. 6) and includes steps 111A, 111B and 111C, as illustrated in FIG. 17.

Figure 18:
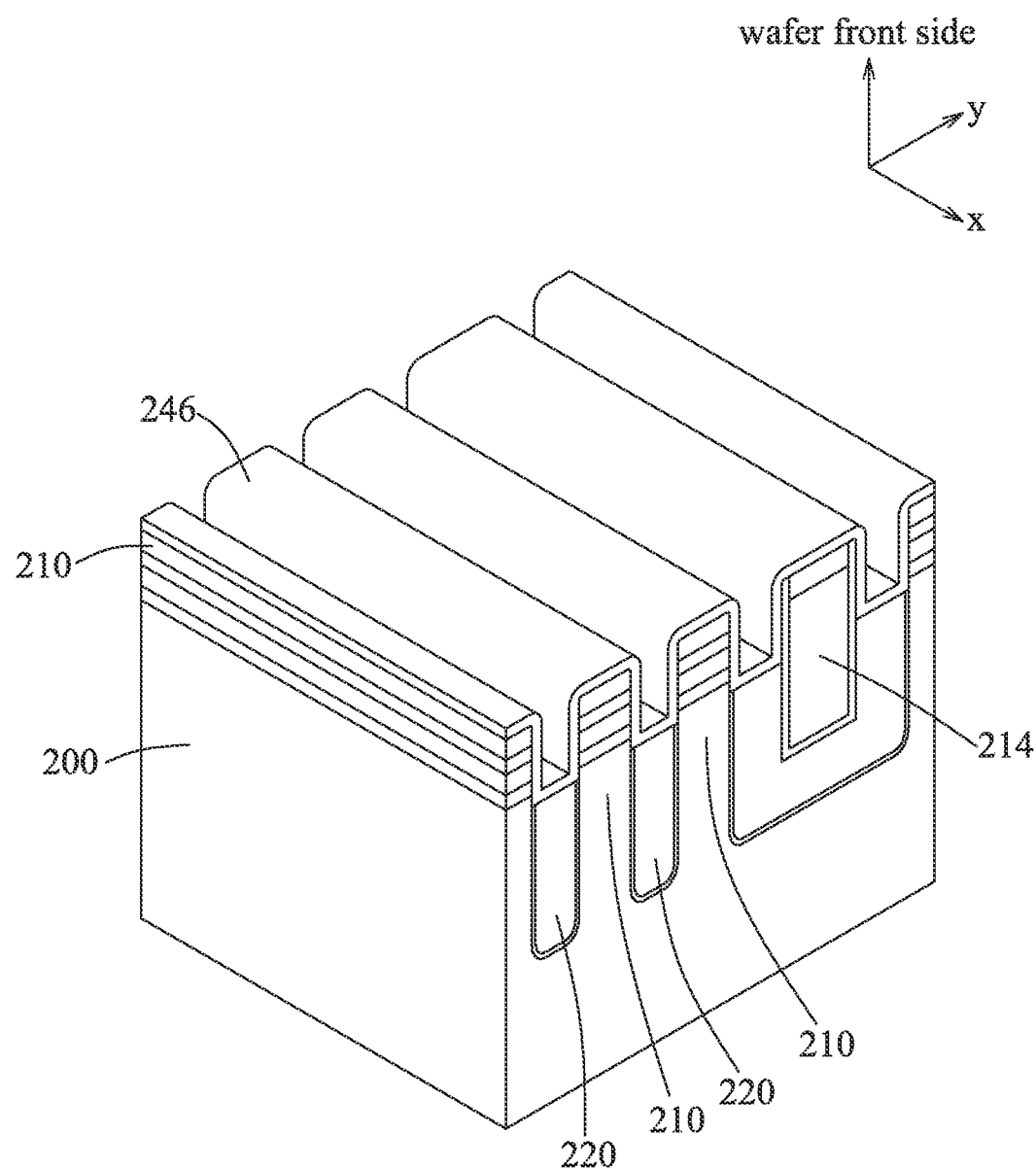
FIGS. 18 through 28 are perspective views that illustrate differences of the second semiconductor process from the first semiconductor process in accordance with some embodiments.

Referring to FIG. 18, in step 111A that follows process 110, a hard mask film 246 is deposited over the front side of the wafer to cover the fins 210, the STI features 220 and the dummy fin 214. The hard mask film 246 may have resistance to the etchant used in process 122 that etches the epitaxial layer 232 (see FIG. 11). In some embodiments, the hard mask film 246 may include any suitable high-k dielectric material or metal oxide material, such as tungsten oxide, hafnium oxide, lanthanum oxide, aluminum oxide, titanium oxide, other suitable materials, or combinations thereof, and can be deposited by any suitable method, such as ALD, CVD, PVD, other suitable methods, or combinations thereof. In some embodiments, the hard mask film 246 has a thickness of between 8 nm and 15 nm, which should be sufficiently large to resist the loss in the subsequent process and to protect the gate features 236 from being etched during the process of cutting the epitaxial layer 232. Note that the upward vertical axis indicates the front side of the wafer in FIG. 18.

Figure 19:
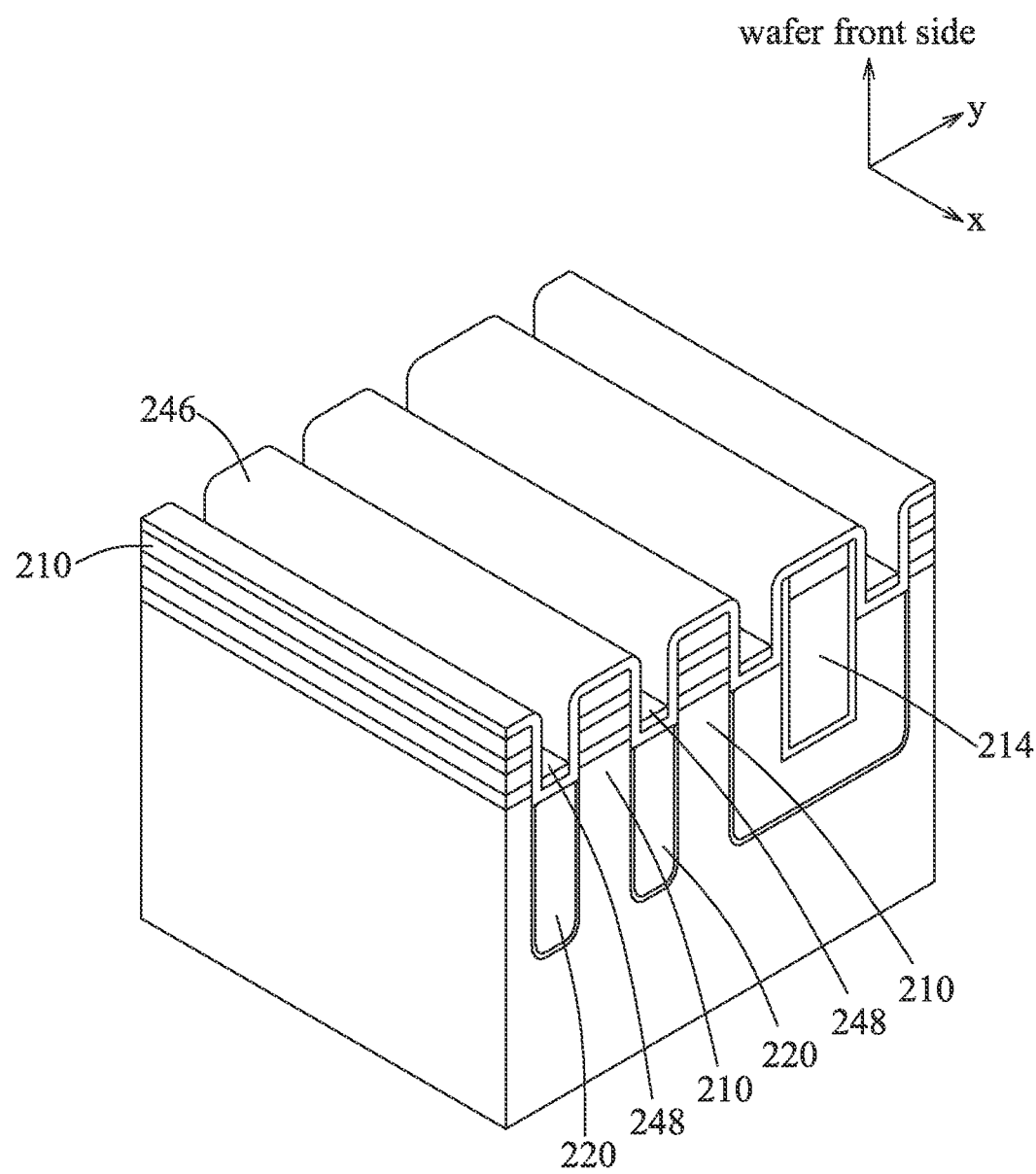

Referring to FIG. 19, in step 111B, a dielectric layer 248 is formed on a portion of the hard mask film 246 in the bottom of the trenches between the fins 210 and between the fins 210 and the dummy fin 214 (i.e., a portion of the hard mask film 246 that corresponds in position to the STI features 220). The dielectric layer 248 may include, for example, silicon oxide, silicon nitride, silicon oxynitride, FSG, a low-k dielectric material, and/or other suitable materials, and is deposited by any suitable method, such as CVD, FCVD, SOG, other suitable methods, or combinations thereof. In some embodiments, the dielectric layer 248 is deposited over the hard mask film 246, followed by a CMP process to reveal the top portion of the hard mask film 246 over the fins 210 and the dummy fin 214. Then, the dielectric layer 248 that is filled in the trenches between the fins 210 and between the fins 210 and the dummy fin 214 is etched, and time for etching the dielectric layer 248 is controlled so that the dielectric layer 248 in the trenches has a desired final thickness, such as between 3 nm to 5 nm, which should be sufficient to protect the portion of the hard mask film 246 in the bottom of the trenches in the subsequent process where the hard mask film 246 is etched. The etching of the dielectric layer 248 may use dry etching, wet etching, RIE, and/or other suitable processes. Note that the upward vertical axis indicates the front side of the wafer in FIG. 19.

Figure 20:
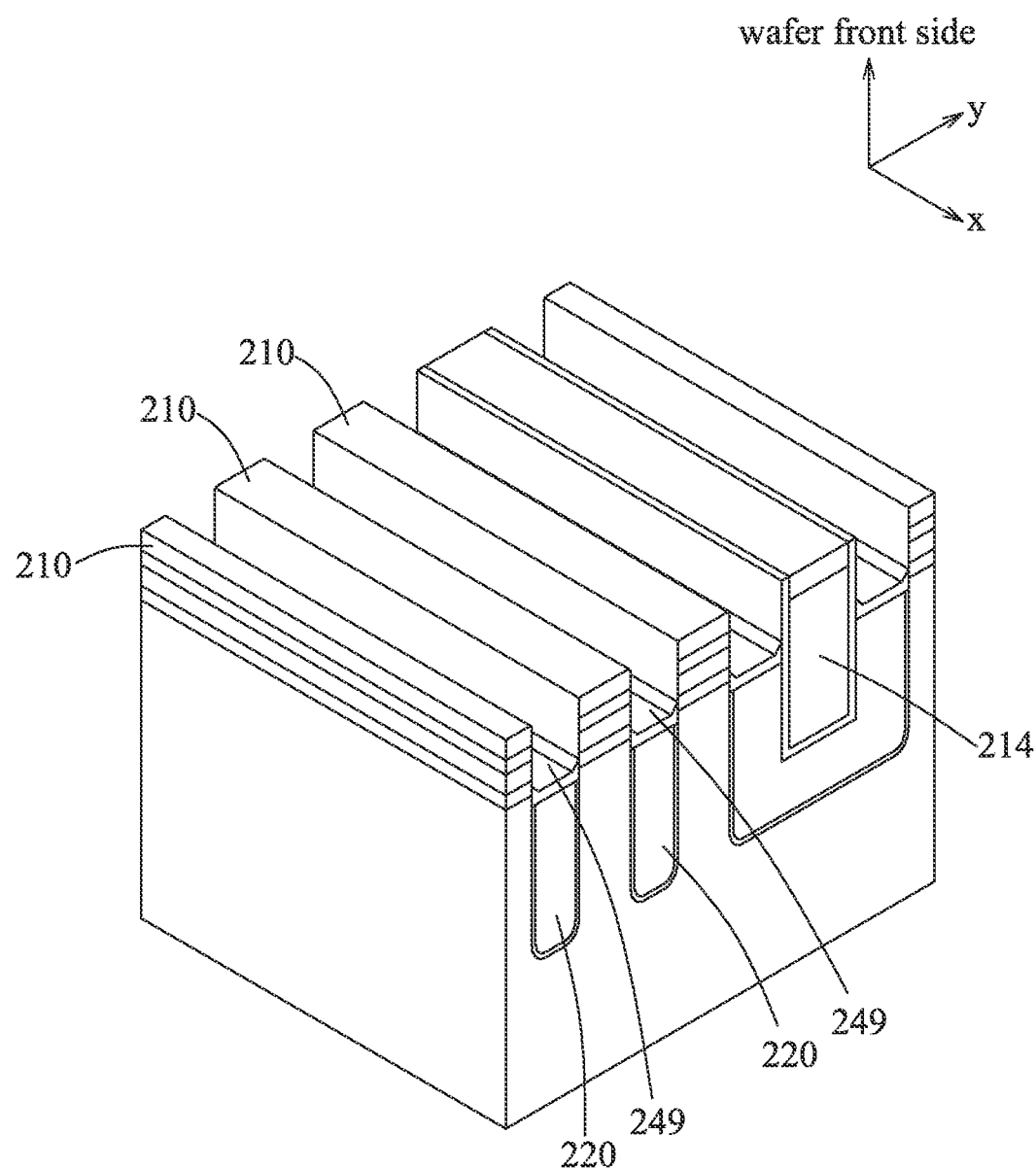
Figure 21:
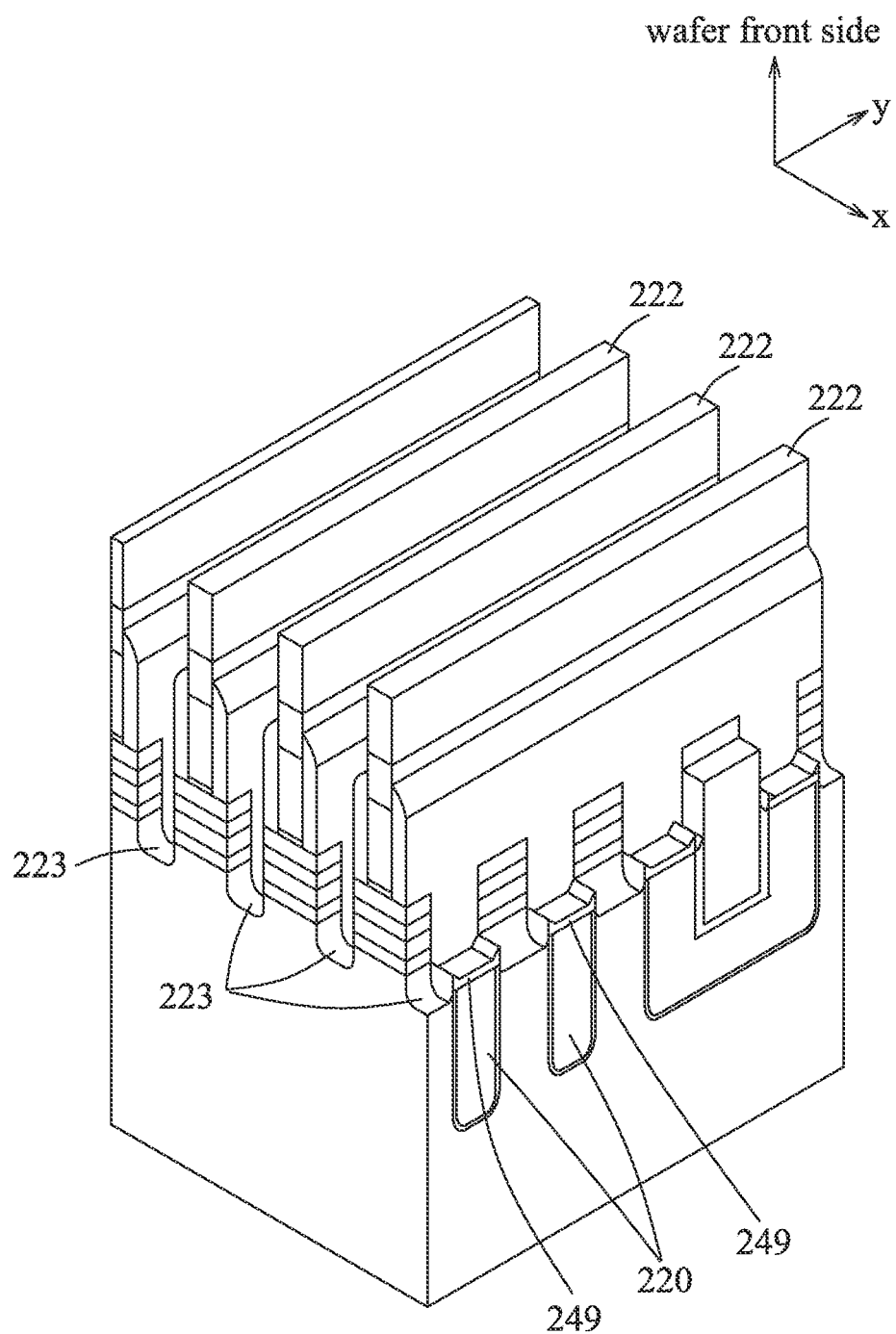
Figure 22:
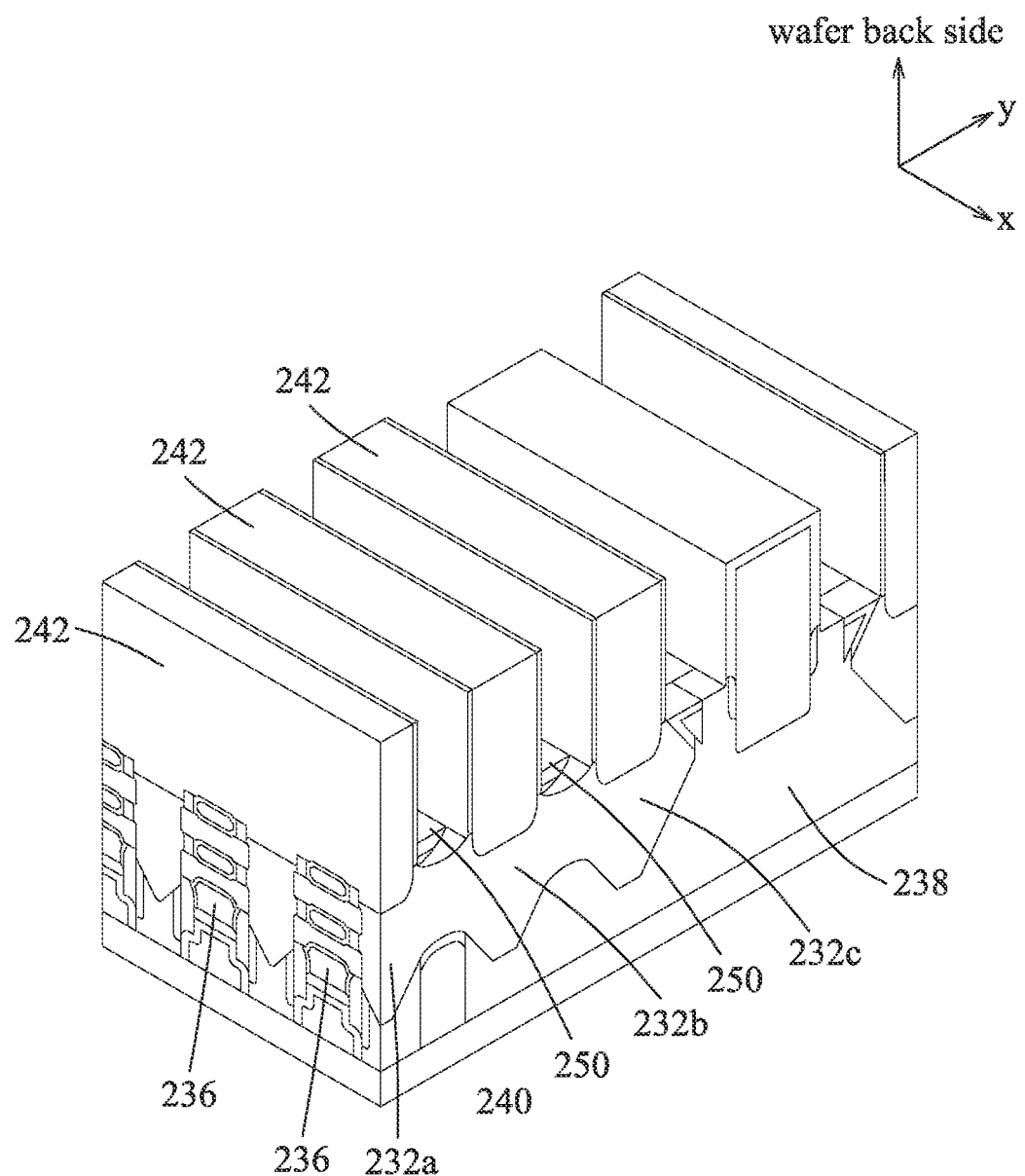

Referring to FIG. 20, step 111C forms a patterned hard mask layer 249 that is disposed over the top surfaces of the STI features 220 to cover the STI features 220 in the bottom of the trenches between the fins and between the fins 210 and dummy fin 214. In some embodiments, the hard mask film 246 is etched using dry etching, wet etching, RIE, and/or other suitable processes, so that only the portion of the hard mask film 246 that is protected by the dielectric layer 248 remains to form the patterned hard mask layer 249. In some embodiments, the hard mask film 246 is etched using an isotropic etching process, such as wet etching, because of its relatively higher etching selectivity (e.g., using $H_3PO_4$ to etch $HfO_2$, using SC1 solution to etch $Al_2O_3$, etc.). In some embodiments, the dielectric layer 248 may be maintained and the flow proceeds to process 112. In some embodiments, after the patterned hard mask layer 249 is formed, the dielectric layer 248 is completely removed using dry etching, wet etching, RIE, and/or other suitable processes, so as to reveal the patterned hard mask layer 249 and avoid some adverse effects that may be caused by the residual dielectric layer 248 in subsequent processes. Then, the abovementioned process 112 follows to form a structure as shown in FIG. 21, where the patterned hard mask layer 249 is partially revealed in the source/drain recesses 223. Then, the revealed portion of the patterned hard mask layer 249 is removed using dry etching, wet etching, RIE, and/or other suitable processes, so as to form hard mask features 250 (i.e., the remaining portions of the patterned hard mask layer 249 as shown in FIG. 22), followed by process 114 to deposit the epitaxial layer 232 (see FIG. 8). Note that the upward vertical axis indicates the front side of the wafer in FIGS. 20 and 21. In the following process 116 that corresponds to FIG. 9, a portion of the gate features 236 are formed over the hard mask features 250, so that the portion of the gate features 236 would correspond in position to and be covered by the hard mask features 250 in the subsequent back-side processes.

Figure 23:
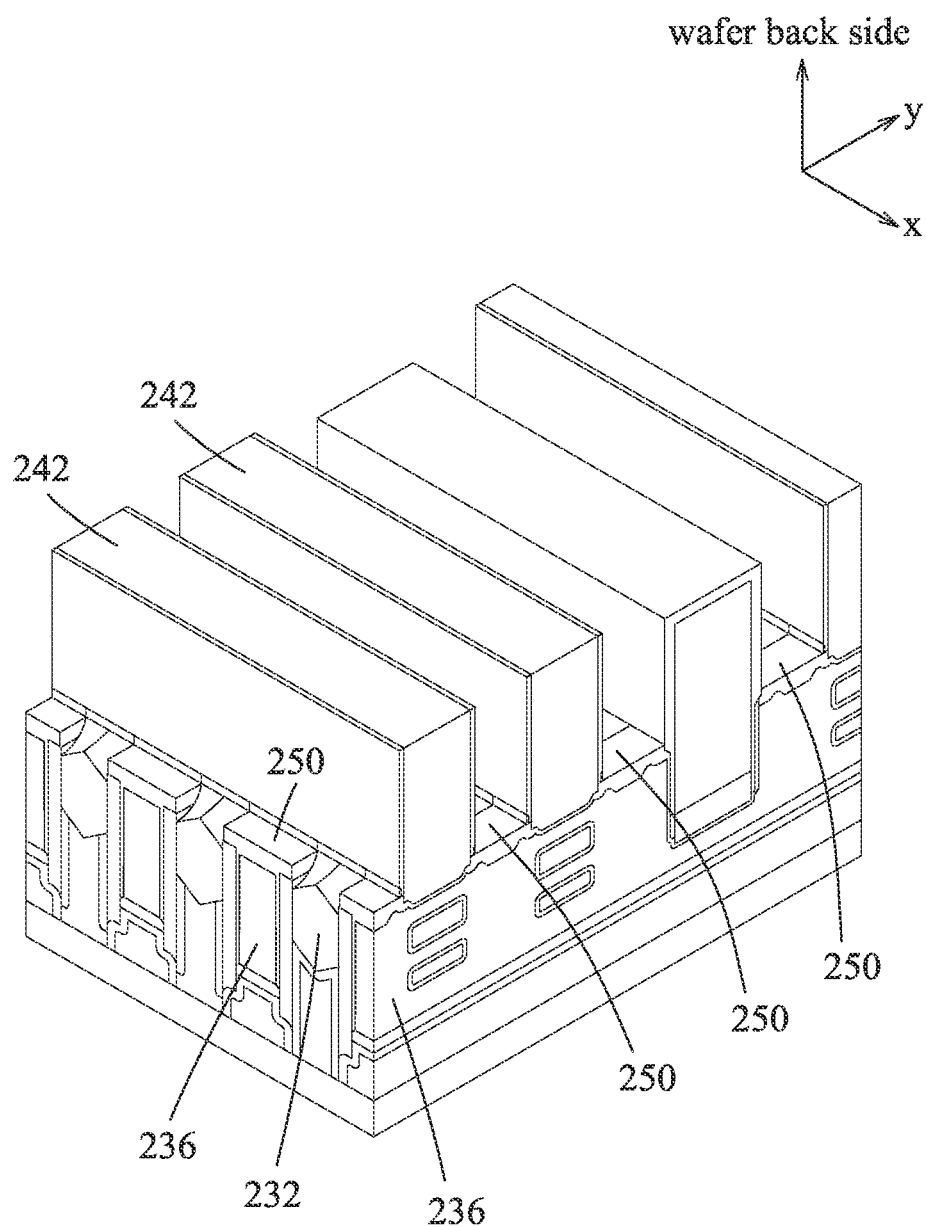
Figure 28:
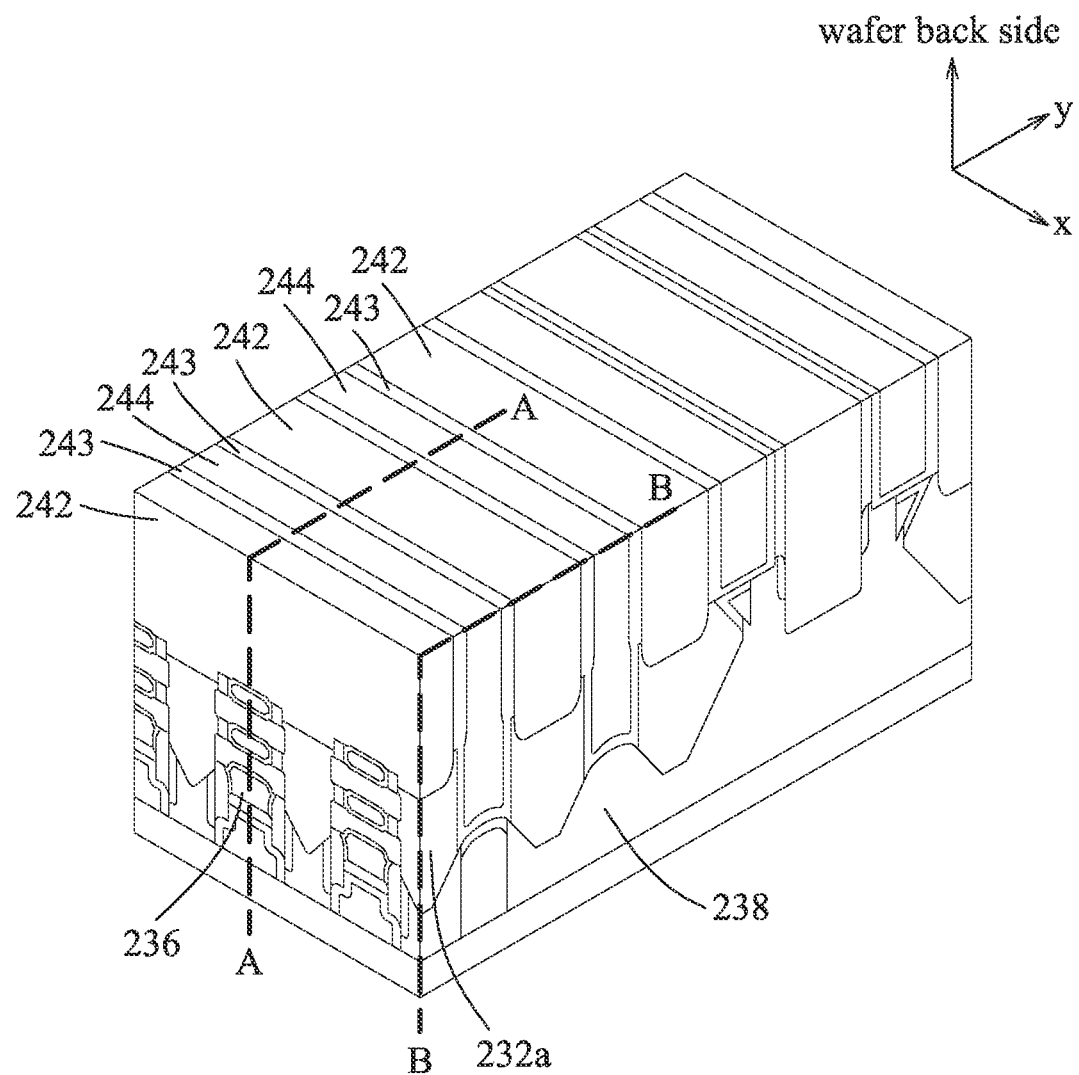

In the embodiments where the hard mask features 250 are formed, process 120 corresponds to FIGS. 22 and 23. FIG. 22 shows a perspective view with sectional views of an X-cut and a Y-cut on the source/drain feature 232a. FIG. 23 shows a perspective view with sectional views of an X-cut on a trench between the mesa features 242, and a Y-cut on the gate feature 236. The hard mask features 250 over the gate features 236 are revealed in the trenches between the mesa features 242 after the STI features 220 are removed. As illustrated in FIG. 28, an etching depth for completely removing the exposed epitaxial layer 232 (e.g., etching to the etch stop layer 241 (i.e., a distance "d4") or to the source/drain contact 238 (i.e., a distance "d5")) may range from between 10 nm and 60 nm. Etching time should be sufficiently long so that the exposed portion of the epitaxial layer 232 can be completely removed. However, in the case that the etch stop layer 241 has poor resistance to the etchant which etches the epitaxial layer 232, the etch stop layer 241 and a portion of the isolation feature 240 under the etch stop layer 241 may be removed, resulting in a greater etching depth, but this may not result in adverse effects on electric properties of the circuit. Note that the upward vertical axis indicates the back side of the wafer in FIGS. 22 and 23.

Figure 24:
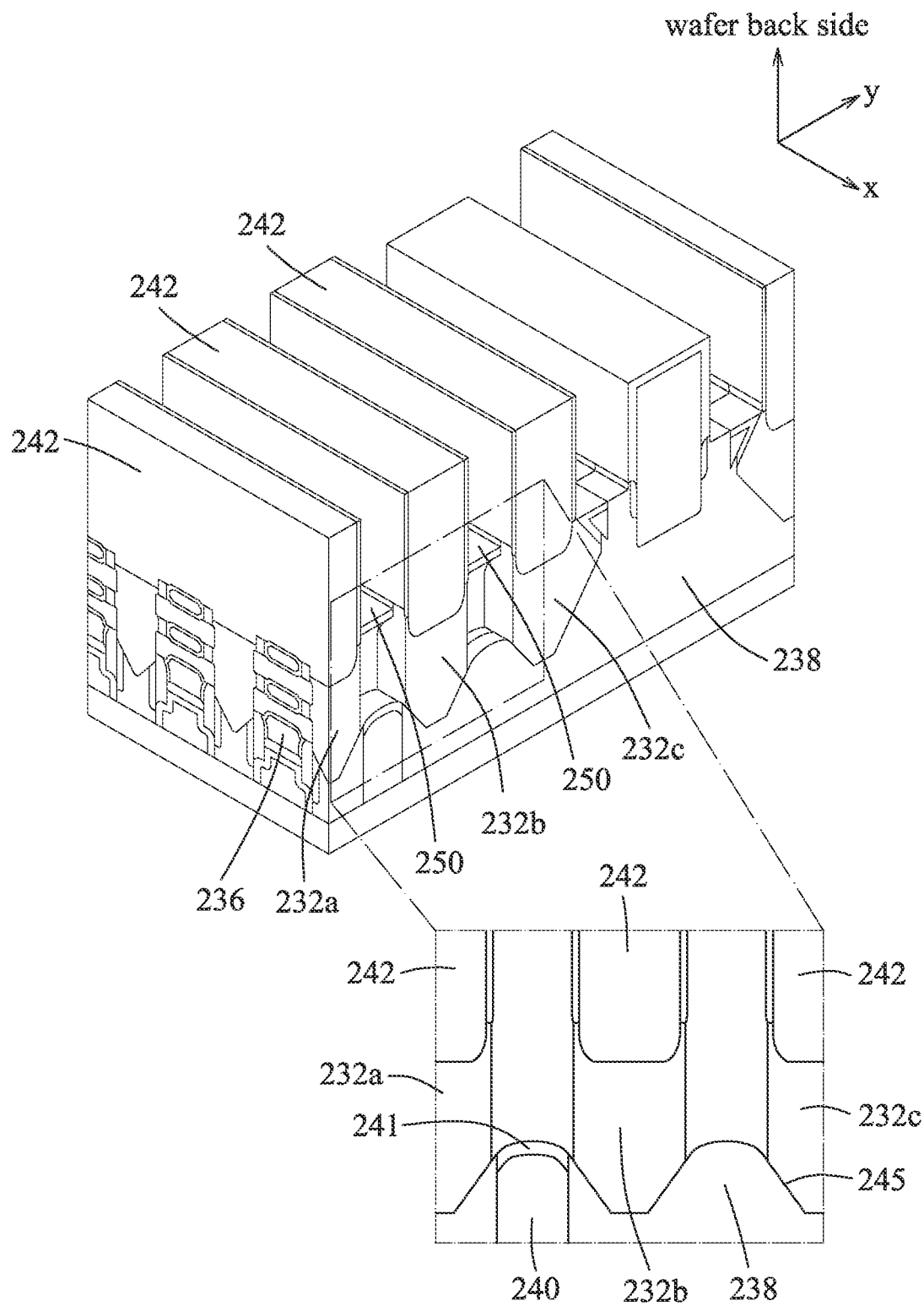
Figure 25:
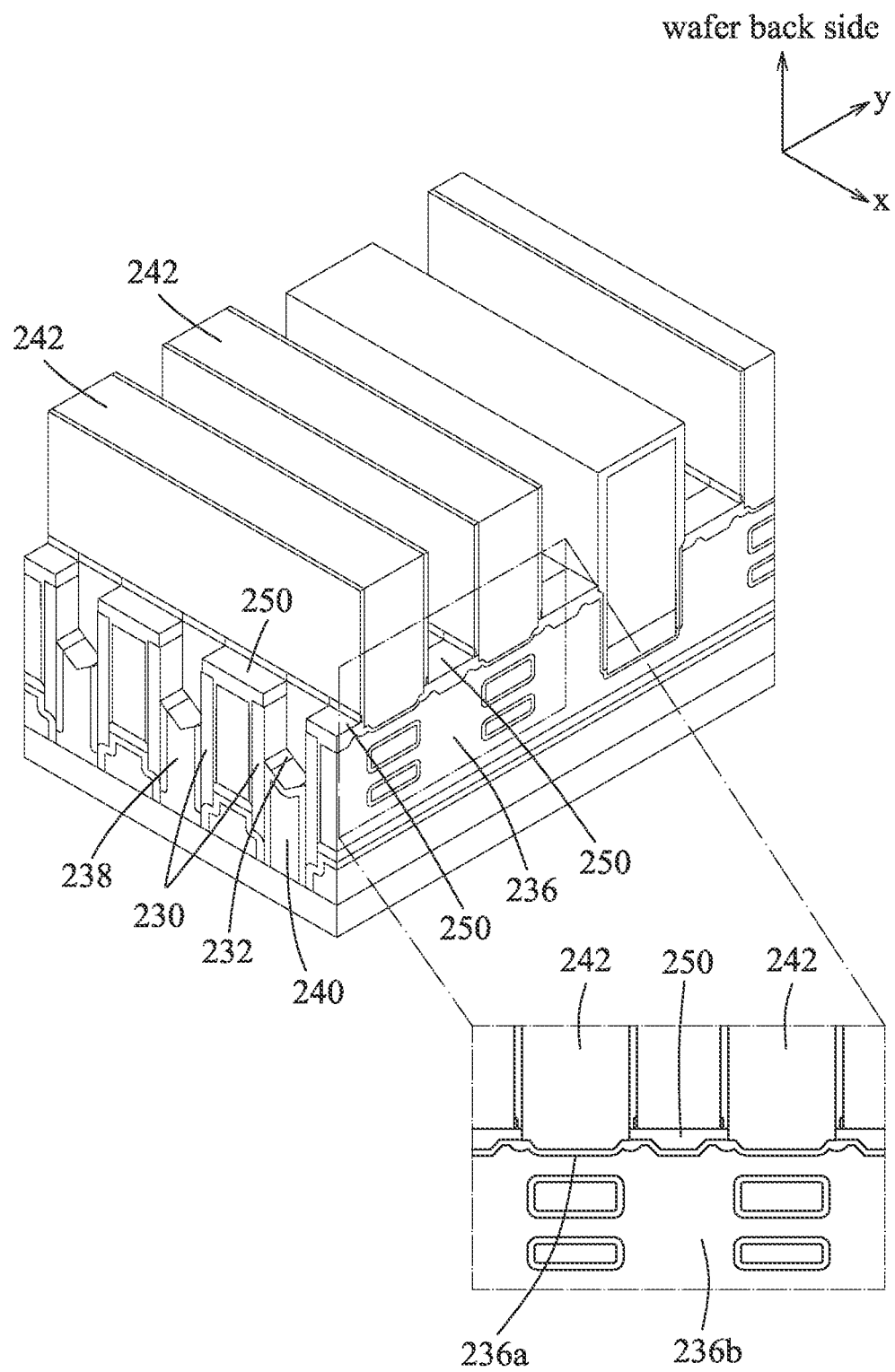

In the embodiments where the hard mask features 250 are formed, process 122 corresponds to FIGS. 24 and 25. FIG. 24 shows a perspective view with sectional views of an X-cut and a Y-cut on the source/drain feature 232a. FIG. 25 shows a perspective view with sectional views of an X-cut on a trench between the mesa features 242, and a Y-cut on the gate feature 236. The gate features 236 are not etched during the etching process for the epitaxial layer 232 because the gate features 236 are covered and protected by the hard mask features 250. With the protection by the hard mask features 250, selection of the etchant used to etch the epitaxial layer 232 may be more flexible, so it is much easier to find an available etchant that induces less damage to other features, such as the dielectric materials between the source/drain contacts 238 and the top spacers 230, the dielectric materials between the isolation feature 240 and the epitaxial layer 232 (e.g., the etch stop layer 241), the isolation feature 240, and so on. Depending on selectivity of the etchant to etch the epitaxial layer 232, the residual silicide layer 245 may have a remaining thickness of between 0 nm (i.e., may be completely etched upon poor etching selectivity) and 10 nm, and the residual etch stop layer 241 may have a remaining thickness of between 0 nm may be completely etched upon poor etching selectivity) and 8 nm. Note that the upward vertical axis indicates the back side of the wafer in FIGS. 24 and 25.

Figure 26:
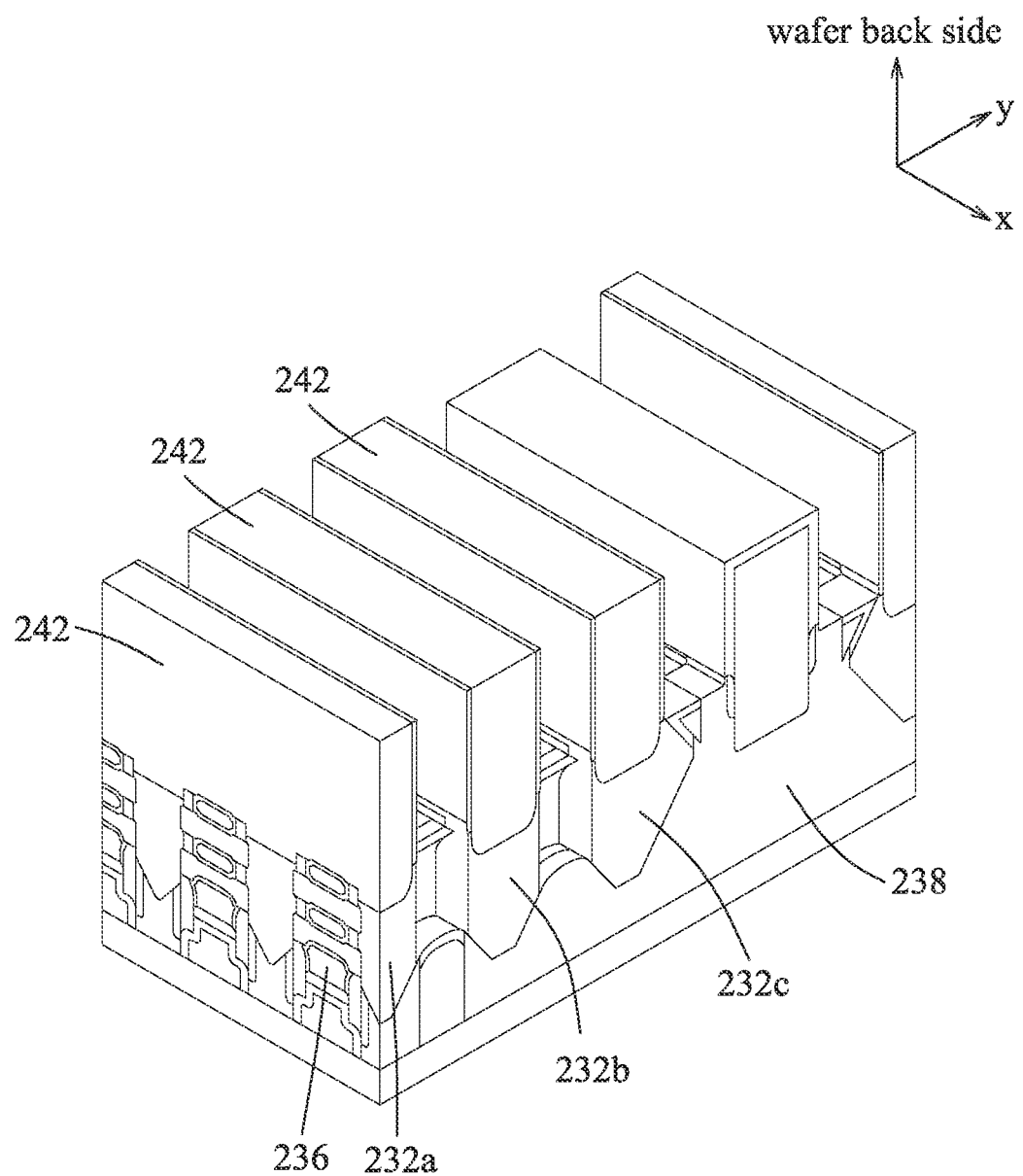
Figure 27:
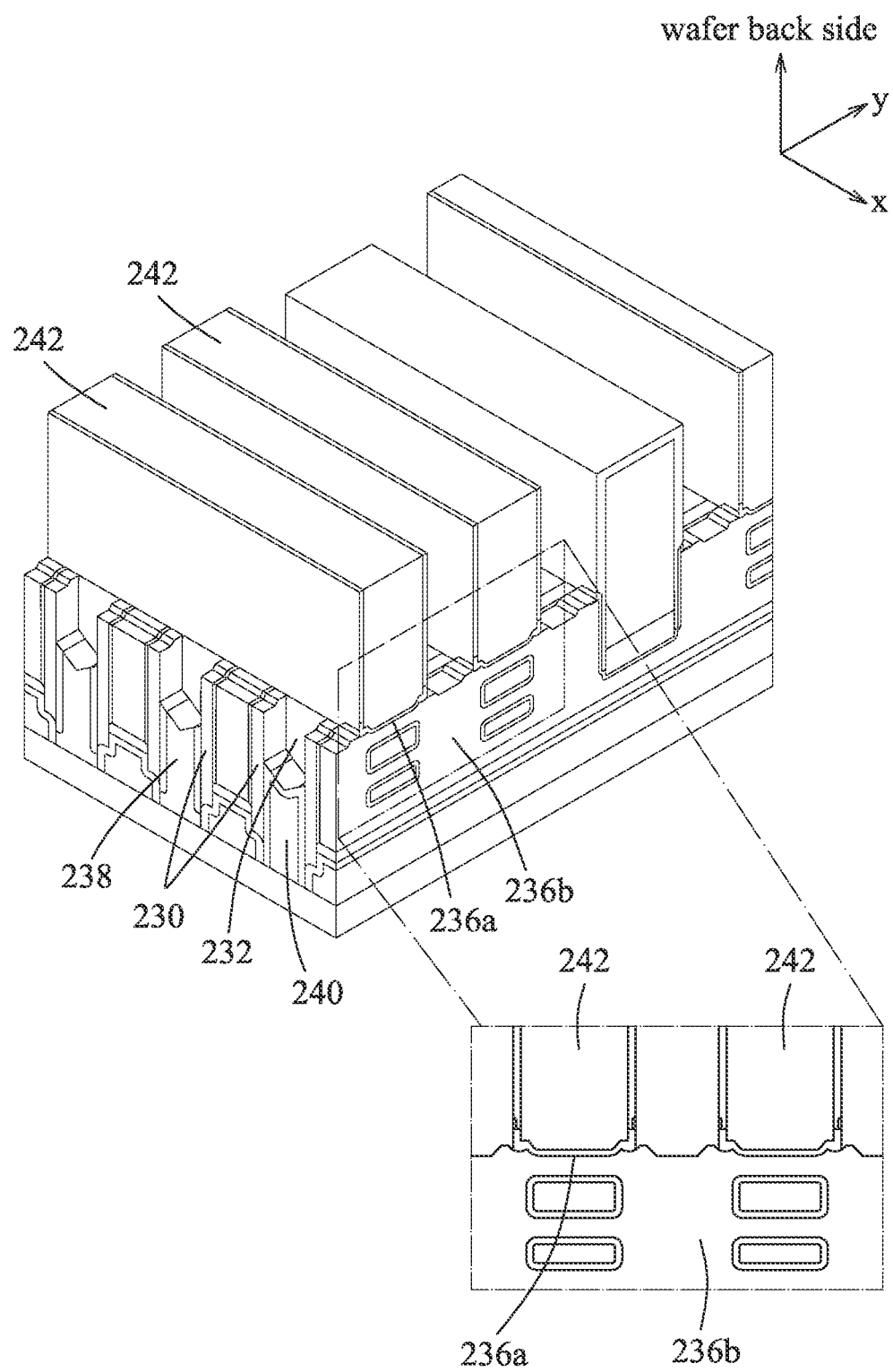

In the embodiments where the hard mask features 250 are formed, process 124 can be directly performed after process 122, or additional process 123 that corresponds to FIGS. 26 and 27 can be performed between processes 122 and 124 to remove the hard mask features 250 (see FIGS. 24 and 25). The removal of the hard mask features 250 can use dry etching, wet etching, RIE, and/or other suitable processes. In some embodiments, the hard mask features 250 are etched using isotropic etching process, such as wet etching. FIG. 26 shows a perspective view with sectional views of an X-cut and a Y-cut on the source/drain feature 232*a*. FIG. 27 shows a perspective view with sectional views of an X-cut on a trench between the mesa features 242, and a Y-cut on the gate feature 236. A top surface of a portion of the metal gate electrode 236*b* under the mesa features 242 and a top surface of a portion of the metal gate electrode 236*b* in the trenches between the mesa features 242 have a comparable level (e.g., smaller than 5 nm) in height due to the protection by the hard mask features 250 during the etching of the epitaxial layer 232. Removal of the hard mask features 250 may reduce capacitance effect. In some embodiments where the hard mask features 250 have similar removal rate or etching rate to the dielectric layer 236*a* of the gate features 236, the dielectric layer 236*b* under the hard mask features 250 may be removed during the etching of the hard mask features 250, and the capacitance effect may be further reduced. Note that the upward vertical axis indicates the back side of the wafer in FIGS. 26 and 27.

Figure 29:
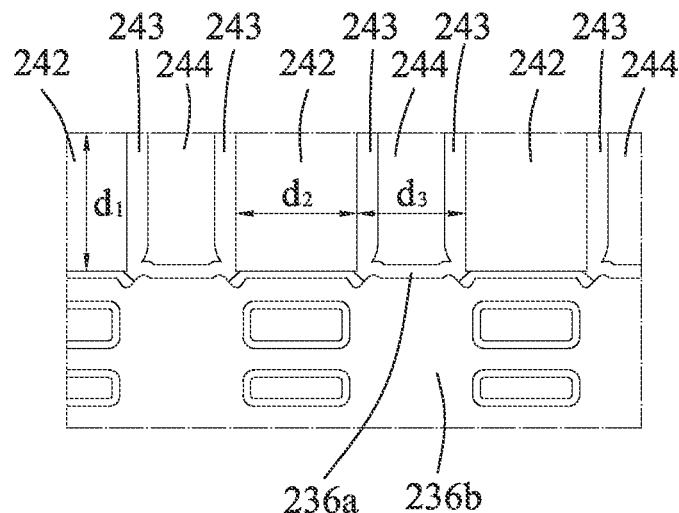
FIGS. 29 and 30 are sectional views taken along line A-A and line B-B in FIG. 28, respectively.
Figure 30:
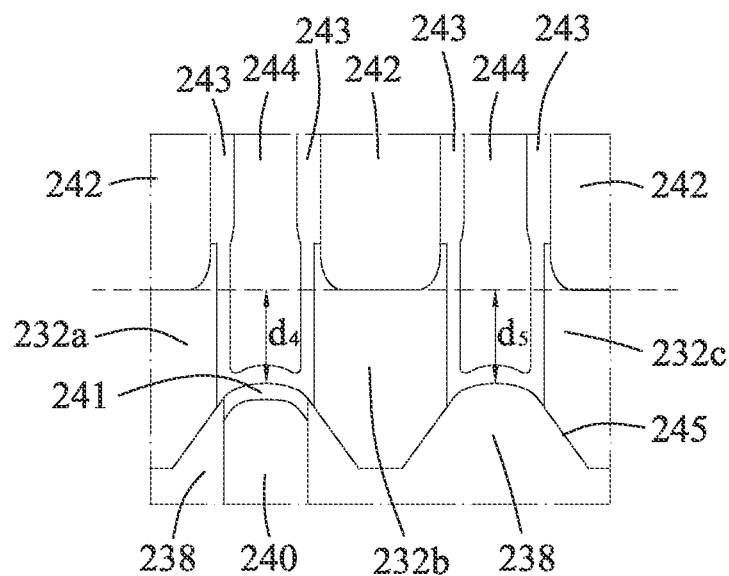

FIG. 28 illustrates a perspective view with sectional views of an X-cut and a Y-cut on the source/drain feature 232*a* after process 124, FIG. 29 illustrates a sectional view taken along line A-A in FIG. 28, and FIG. 30 illustrates a sectional view taken along line B-B in FIG. 28. In some embodiments, the mesa features 242 may have a height (d1) ranging, for example but not limited to, between 5 nm and 80 nm. In some embodiments, the source/drain features 232*a*, 232*b*, 232*c* correspond to the widths of the mesa features 242, which may have a width (d2) ranging, for example but not limited to, between 10 nm and 100 nm. In some embodiments, the spaces/distances between adjacent source/drain features (e.g., between the source/drain features 232*a*, 232*b*, or between the source/drain features 232*b*, 232*c*) correspond to distances (d3) between adjacent mesa features 242, which may range from, for example, between 10 nm and 50 nm.

As a result, by forming the hard mask features 250 over the gate features 236 during the front side process of the wafer, the metal gate electrode 236*b* may be protected from being etched during the etching process to cut the epitaxial layer 232 from the back side of the wafer, so the portion of the metal gate electrode 236*b* at the source/drain regions and the portion of the metal gate electrode 236*b* at the non-source/drain regions can have comparable level in height, thereby achieving better electric properties.

In accordance with some embodiments of the present disclosure, a method for fabricating a semiconductor device includes: forming, on a substrate, a semiconductor fin feature that extends from a reference substrate surface of the substrate at a front side of the substrate; forming, at the front side of the substrate, a hard mask feature over the reference substrate surface at a region that corresponds in position to a metal portion of the semiconductor device; forming an epitaxial layer over the reference substrate surface at the front side of the substrate to form an epitaxial portion of the semiconductor device; revealing a to-be-removed portion of the epitaxial layer from a back side of the substrate opposite to the front side of the substrate; and etching the to-be-removed portion of the epitaxial layer from the back side of the substrate.

In accordance with some embodiments of the present disclosure, a method for fabricating a semiconductor circuit includes: forming fin features on a semiconductor substrate at a front side of the semiconductor substrate, the fin features extending in an X-direction and arranged in a Y-direction transverse to the X-direction; forming, at the front side of the semiconductor substrate, a hard mask layer in isolation recesses between the fin features, the isolation recesses extending in the X-direction; etching the fin features to form base fins and source/drain recesses at the front side of the semiconductor substrate, the source/drain recesses extending along the Y-direction between the base fins; removing a portion of the hard mask layer in the source/drain recesses; forming an epitaxial layer in the source/drain recesses at the front side of the semiconductor substrate to form source/drain features of semiconductor devices of the semiconductor circuit; forming gate features of the semiconductor devices on the base fins at the front side of the semiconductor substrate, the gate features extending in the Y-direction; revealing a to-be-removed portion of the epitaxial layer that corresponds in position to the isolation recesses from a back side of the semiconductor substrate opposite to the front side of the semiconductor substrate; and etching the to-be-removed portion of the epitaxial layer from the back side of the semiconductor substrate.

In accordance with some embodiments of the present disclosure, a method for fabricating a semiconductor circuit includes: forming a plurality of semiconductor device features at a front side of a semiconductor substrate, the semiconductor device features including semiconductor fins, a gate metal layer to form gate features connected to the semiconductor fins, an epitaxial layer to form source/drain features connected to the semiconductor fins, and hard mask features under the gate metal layer at the front side of the semiconductor substrate; revealing the to-be-removed portion of the epitaxial layer from a back side of the semiconductor substrate opposite to the front side of the semiconductor substrate; and etching the to-be-removed portion of the epitaxial layer from the back side of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device that has a gate electrode and a pair of source/drain features, comprising:

forming a semiconductor fin feature on a substrate at a first side of the substrate;

forming, at the first side of the substrate, a hard mask feature over the substrate at a region that corresponds in position to a portion of the gate electrode of the semiconductor device that is to be formed on the substrate;

forming, after the hard mask feature is formed, the gate electrode of the semiconductor device at the first side of the substrate, wherein the portion of the gate electrode is disposed at the first side of the hard mask feature;

forming an epitaxial layer at the first side of the substrate; and etching a to-be-removed portion of the epitaxial layer from a second side of the substrate to form the source/drain features of the semiconductor device, wherein the second side is opposite to the first side, and the hard mask feature covers the portion of the gate electrode during the etching of the to-be-removed portion of the epitaxial layer to protect, the portion of the gate electrode from being damaged.

2. The method of claim 1, further comprising removing the hard mask feature from the second side of the substrate after etching the to-be-removed portion of the epitaxial layer.

3. The method of claim 1, wherein forming the hard mask feature includes:

depositing a hard mask film over the substrate at the first side of the substrate;

forming a dielectric layer over a portion of the hard mask film at the first side of the substrate; and etching a portion of the hard mask film that is exposed from the dielectric layer to form a patterned hard mask layer.

4. The method of claim 3, wherein forming the hard mask feature further includes:

etching a portion of the semiconductor fin feature to define a gate region and active regions of the semiconductor device; and removing a portion of the patterned hard mask layer that is exposed from the active regions of the semiconductor device to form the hard mask feature.

5. The method of claim 4, wherein the epitaxial layer is deposited in a recess formed by etching the portion of the semiconductor fin feature.

6. The method of claim 1, wherein the substrate includes an isolation feature adjacent to the semiconductor fin feature, the hard mask feature is formed over a portion of the isolation feature at the first side of the substrate, and the to-be-removed portion of the epitaxial layer corresponds in position to the isolation feature;

wherein etching the to-be-removed portion of the epitaxial layer from the second side of the substrate includes:

removing a second-side portion of the substrate from the second side of the substrate to reveal the isolation feature;

removing the isolation feature from the second side of the substrate; and etching the to-be-removed portion of the epitaxial layer that is exposed from a trench formed by removing the isolation feature.

7. The method of claim 6, further comprising:

filling a dielectric material into the trench formed by removing the isolation feature after etching the to-be-removed portion of the epitaxial layer.

8. The method of claim 6, wherein removing the second-side portion of the substrate is performed using a chemical-mechanical planarization (CMP) technique, and etching the to-be-removed portion of the epitaxial layer from the second side of the substrate further includes, before removing the isolation feature:

removing a portion of the substrate other than the isolation feature after removing the second-side portion of the substrate; and filling a low-k dielectric material into recesses formed by removing the portion of the substrate other than the isolation feature.

9. The method of claim 1, wherein the hard mask feature includes a high-k dielectric material, and has a thickness of between 8 nm and 15 nm.

10. A method for fabricating a semiconductor circuit, comprising:

forming fin features on a semiconductor substrate at a first side of the semiconductor substrate, the fin features extending in an X-direction and arranged in a Y-direction transverse to the X-direction;

forming, at the first side of the semiconductor substrate, a hard mask layer in isolation recesses between the fin features, the isolation recesses extending in the X-direction;

etching the fin features to form base fins and source/drain recesses at the first side of the semiconductor substrate, the source/drain recesses extending along the Y-direction between the base tins;

removing a portion of the hard mask layer in the source/drain recesses;

forming an epitaxial layer in the source/drain recesses at the first side of the semiconductor substrate to form source/drain features of semiconductor devices of the semiconductor circuit;

forming gate features of the semiconductor devices on the base fins at the first side of the semiconductor substrate, the gate features extending in the Y-direction and overlapping a remaining portion of the hard mask layer that remains after removing the portion of the hard mask layer; and etching a to-be-removed portion of the epitaxial layer from a second side of the semiconductor substrate, wherein the second side is opposite to the first side, and the remaining portion of the hard mask layer covers portions of the gate features of the semiconductor devices during the etching of the to-be-removed portion of the epitaxial layer to protect the portions of the gate features of the semiconductor devices from being damaged.

11. The method of claim 10, further comprising removing the hard mask layer from the second side of the semiconductor substrate after etching the to-be-removed portion of the epitaxial layer, followed by filling a dielectric material into recesses formed by etching the to-be-removed portion of the epitaxial layer.

12. The method of claim 10, wherein forming the hard mask layer includes:

depositing a first dielectric layer over the semiconductor substrate at the first side of the semiconductor substrate after forming the fin features on the semiconductor substrate;

forming a second dielectric layer over a portion of the first dielectric layer in the isolation recesses at the first side of the semiconductor substrate; and etching the first dielectric layer after the second dielectric layer is formed, so as to form the hard mask layer.

13. The method of claim 12, wherein the first dielectric layer includes a high-k dielectric material, and the second dielectric layer includes a low-k dielectric material.

14. The method of claim 10, further comprising forming isolation features in the semiconductor substrate, the isolation features corresponding in position to and being exposed in the isolation recesses at the first side of the semiconductor substrate; and wherein, in forming the hard mask layer, the hard mask layer is formed over the isolation features at the first side of the semiconductor substrate.

15. The method of claim 14, wherein etching the to-be-removed portion of the epitaxial layer from the second side of the semiconductor substrate includes:

removing a second-side portion of the semiconductor substrate from the second side of the semiconductor substrate to reveal the isolation features;

removing the isolation features from the second side of the semiconductor substrate; and etching the to-be-removed portion of the epitaxial layer that is exposed from trenches formed by removing the isolation features.

16. The method of claim 15, wherein removing the second-side portion of the semiconductor substrate is performed using a chemical-mechanical planarization (CMP) technique, and etching the to-be-removed portion of the epitaxial layer from the second side of the semiconductor substrate further includes, before removing the isolation feature:

removing a portion of the semiconductor substrate other than the isolation features after removing the second-side portion of the semiconductor substrate; and filling a low-k dielectric material into recesses formed by removing the portion of the semiconductor substrate other than the isolation features.

17. A method of fabricating a semiconductor circuit, comprising:

forming a plurality of semiconductor device features at a first side of a semiconductor substrate, the semiconductor device features including semiconductor fins, a gate metal layer to form gate features connected to the semiconductor fins, an epitaxial layer to form source/drain features connected to the semiconductor fins, and hard mask features disposed at a second side of the gate metal layer, wherein the second side is opposite to the first side; and etching a to-be-removed portion of the epitaxial layer from the second side of the semiconductor substrate to form the source/drain features, wherein the hard mask features cover a portion of the gate metal layer during the etching of the to-be-removed portion of the epitaxial layer to protect the portion of the gate metal layer from being damaged.

18. The method of claim 17, further comprising removing the hard mask features from the second side of the semiconductor substrate after etching the to-be-removed portion of the epitaxial layer, followed by filling a dielectric material into recesses formed by etching the to-be-removed portion of the epitaxial layer.

19. The method of claim 17, wherein the hard mask features include a high-k dielectric material and each have a thickness of between 8 nm and 15 nm.

20. The method of claim 17, wherein the semiconductor substrate includes isolation features that correspond in position to recesses between the semiconductor fins and that are disposed at the second side of the epitaxial layer, and etching the to-be-removed portion of the epitaxial layer from the second side of the semiconductor substrate includes:

removing a second-side portion of the semiconductor substrate from the second side of the semiconductor substrate to reveal the isolation features; and removing the isolation features from the second side of the semiconductor substrate.

* * * * *